US010686010B2

(12) United States Patent
 Slovin et al.

(10) Patent No.: US 10,686,010 B2
(45) Date of Patent: Jun. 16, 2020

(54) FABRICATION OF SEMICONDUCTOR DEVICE USING A SHARED MATERIAL IN A PHASE-CHANGE MATERIAL (PCM) SWITCH REGION AND A RESONATOR REGION

(71) Applicant: Newport Fab, LLC, Newport Beach, CA (US)

(72) Inventors: Gregory P. Slovin, Irvine, CA (US); Nabil El-Hinnawy, Irvine, CA (US); Jefferson E. Rose, Hawthorne, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/387,171

(22) Filed: Apr. 17, 2019

(65) Prior Publication Data

US 2020/0058703 A1 Feb. 20, 2020

Related U.S. Application Data

(63) Continuation-in-part of application No. 16/161,960, filed on Oct. 16, 2018, which is a continuation-in-part
(Continued)

(51) Int. Cl.
 *H01L 27/24* (2006.01)
 *H01L 45/00* (2006.01)
(Continued)

(52) U.S. Cl.
 CPC ............. *H01L 27/24* (2013.01); *H01L 27/20* (2013.01); *H01L 41/09* (2013.01); *H01L 41/18* (2013.01);
(Continued)

(58) Field of Classification Search
 None
 See application file for complete search history.

(56) References Cited

U.S. PATENT DOCUMENTS 5,976,932 A 11/1999 Kerber
6,448,576 B1 9/2002 Davis
(Continued)

FOREIGN PATENT DOCUMENTS

WO WO 2016/028362 2/2016

OTHER PUBLICATIONS

Surface Acoustic Wave Resonator by Kandel (Year: 2017).*
(Continued)

*Primary Examiner* — Evren Seven
(74) *Attorney, Agent, or Firm* — Farjami & Farjami LLP

(57) ABSTRACT

In fabricating a semiconductor device, a shared material is formed in a resonator region of the semiconductor device and in a phase-change material (PCM) switch region of the semiconductor device. A portion of the shared material is removed to concurrently form a heat spreader comprising the shared material in the PCM switch region and a piezoelectric segment comprising the shared material in the resonator region. The piezoelectric segment in the resonator region and the heat spreader in the PCM switch region are situated at substantially the same level in the semiconductor device. The PCM switch region includes a heating element between the heat spreader and a PCM. The resonator region includes the piezoelectric segment between two electrodes.

20 Claims, 26 Drawing Sheets

Related U.S. Application Data of application No. 16/114,106, filed on Aug. 27, 2018, which is a continuation-in-part of application No. 16/103,646, filed on Aug. 14, 2018, now Pat. No. 10,475,993, which is a continuation-in-part of application No. 16/103,490, filed on Aug. 14, 2018, now Pat. No. 10,476,001, which is a continuation-in-part of application No. 16/103,587, filed on Aug. 14, 2018, now Pat. No. 10,461,253.

(51) Int. Cl.
| | | |
|---|---|---|
| *H01L 27/20* | (2006.01) | |
| *H01L 41/18* | (2006.01) | |
| *H01L 41/09* | (2006.01) | |
| *H01L 41/29* | (2013.01) | |

(52) U.S. Cl.
CPC .............. *H01L 41/29* (2013.01); *H01L 45/06* (2013.01); *H01L 45/1226* (2013.01); *H01L 45/1286* (2013.01); *H01L 45/143* (2013.01); *H01L 45/144* (2013.01); *H01L 45/1608* (2013.01)

(56) References Cited

U.S. PATENT DOCUMENTS

| | | |
|---|---|---|
| 7,522,029 B1 | 4/2009 | Lantz |
| 8,314,983 B2 | 11/2012 | Frank |
| 9,257,647 B2 | 2/2016 | Borodulin |
| 9,362,492 B2 | 6/2016 | Goktepeli |
| 9,368,720 B1 | 6/2016 | Moon |
| 9,444,430 B1 | 9/2016 | Abdo |
| 9,640,759 B1 | 5/2017 | Curioni |
| 9,891,112 B1 | 2/2018 | Abel |
| 9,917,104 B1 | 3/2018 | Roizin |
| 10,128,243 B2 | 11/2018 | Yoo |
| 2005/0127348 A1 | 6/2005 | Horak |
| 2006/0246712 A1 | 11/2006 | Kim |
| 2007/0075347 A1 | 4/2007 | Lai |
| 2008/0142775 A1 | 6/2008 | Chen |
| 2010/0084626 A1 | 4/2010 | Delhougne |
| 2010/0238720 A1 | 9/2010 | Tio Castro |
| 2011/0291784 A1 | 12/2011 | Nakatsuji |
| 2013/0187120 A1 | 7/2013 | Redaelli |
| 2013/0285000 A1 | 10/2013 | Arai |
| 2014/0191181 A1 | 7/2014 | Moon |
| 2014/0264230 A1 | 9/2014 | Borodulin |
| 2014/0339610 A1 | 11/2014 | Rashed |
| 2015/0048424 A1 | 2/2015 | Tien |
| 2015/0090949 A1 | 4/2015 | Chang |
| 2015/0333131 A1 | 11/2015 | Mojumder |
| 2016/0035973 A1 | 2/2016 | Raieszadeh |
| 2016/0071653 A1 | 3/2016 | Lamorey |
| 2016/0308507 A1 | 10/2016 | Engelen |
| 2017/0092694 A1 | 3/2017 | BrightSky |
| 2017/0126205 A1 | 5/2017 | Lin |
| 2017/0187347 A1* | 6/2017 | Rinaldi .................. H03H 9/205 |
| 2017/0243861 A1 | 8/2017 | Wang |
| 2017/0365427 A1 | 12/2017 | Borodulin |
| 2018/0005786 A1 | 1/2018 | Navarro |
| 2018/0194615 A1 | 7/2018 | Nawaz |
| 2018/0269393 A1 | 9/2018 | Zhang |
| 2019/0064555 A1 | 2/2019 | Hosseini |
| 2019/0067572 A1 | 2/2019 | Tsai |
| 2019/0172657 A1 | 6/2019 | Zhu |
| 2019/0267214 A1 | 8/2019 | Liu |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

H. C. Pineda, "Thin Film Bulk Acoustic Wave Resonator-FBAR Fabrication, Heterogeneous Integration with CMOS Technologies, and Sensor Applications," [Ph.D. thesis], Universite de Montpellier II, Montpellier, France; Universitat Autonoma de Barcelona, Barcelona,Spain, 2007. pp. 1-241.

* cited by examiner

FABRICATION OF SEMICONDUCTOR DEVICE USING A SHARED MATERIAL IN A PHASE-CHANGE MATERIAL (PCM) SWITCH REGION AND A RESONATOR REGION

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The present application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance,". The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous phase, phase-change materials may need to achieve temperatures of approximately seven hundred degrees Celsius (700° C.) or more, and may need to cool down within hundreds of nanoseconds. In order to rapidly cool down phase-change materials (PCM), heat must be dissipated from a PCM RF switch by using heat spreading techniques.

Unique requirements for materials, fabrication steps and design layouts for PCM RF switches may pose design challenges for other components and circuits in large scale integration with PCM RF switches. Other components of a semiconductor device in RF applications, such as resonators utilized in RF filters and oscillators, have their own requirements for materials, fabrication steps, and design layouts. Large scale integration of resonators may not be easily compatible with PCM RF switches using conventional fabrication techniques. For example, various modifications in design layout, materials and fabrication steps have significant impact on thermal energy management and can decrease the reliability of PCM RF switches. Specialty manufacturing is often impractical, and large scale manufacturing generally trades practicality for the ability to control performance characteristics of PCM RF switches and resonators.

Thus, there is need in the art for effective and practical large scale integration of PCM RF switches with resonators.

SUMMARY

The present disclosure is directed to fabrication of a semiconductor device using a shared material in a phase-change material (PCM) switch region and a resonator region, substantially as shown in and/or described in connection with at least one of the figures, and as set forth in the claims.

DETAILED DESCRIPTION

Figure 1A:
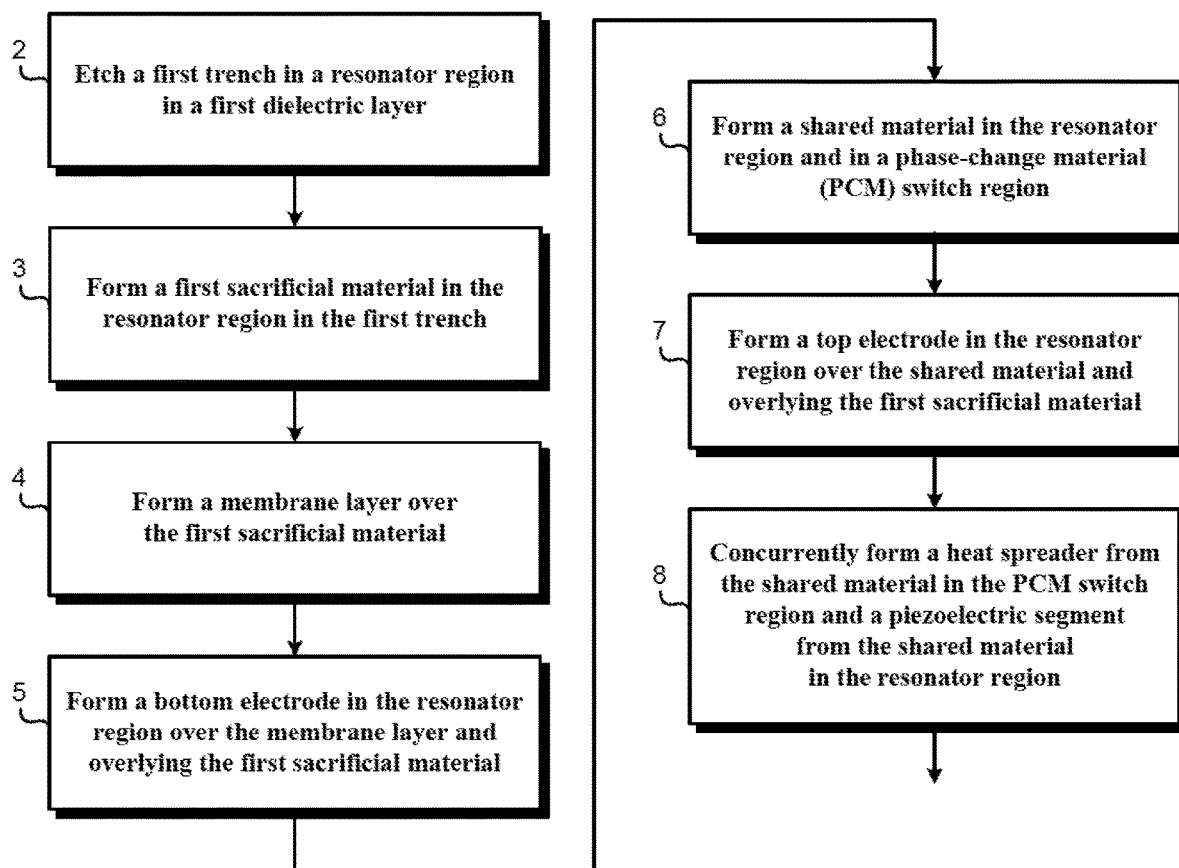
FIGS. 1A, 1B and 1C illustrate a flowchart of an exemplary method for manufacturing a semiconductor device having a phase change material (PCM) switch region and a resonator region by using a shared material, according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1B:
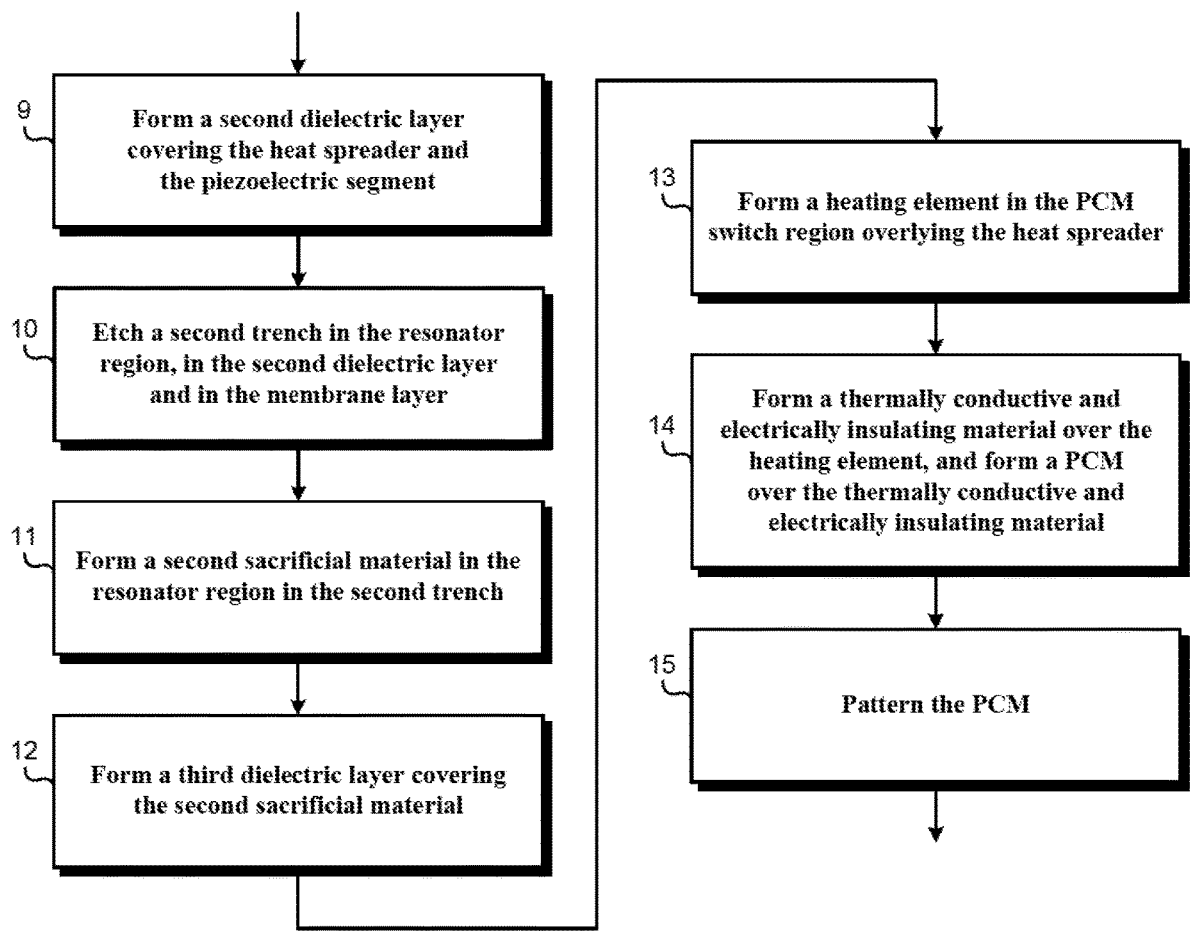
Figure 1C:
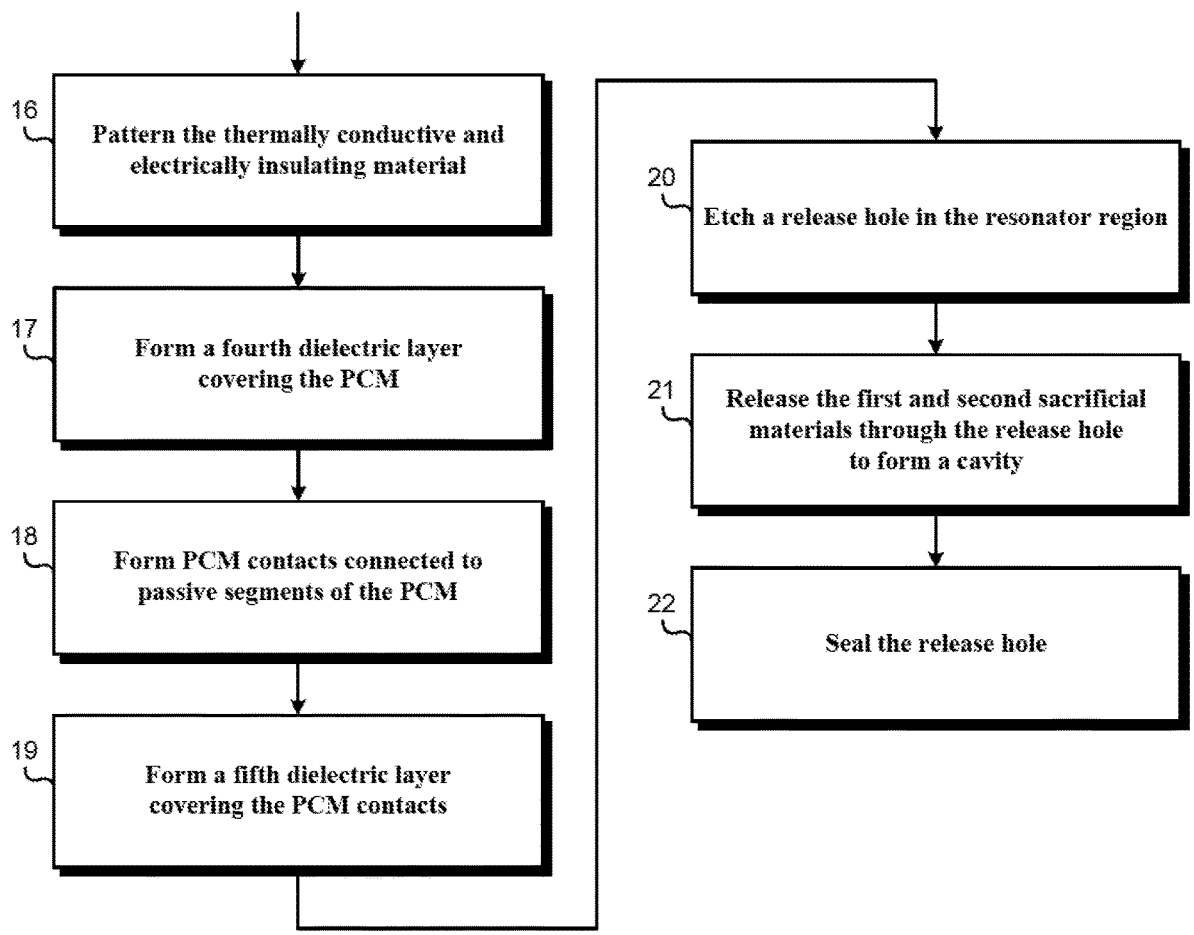
Figure 2:
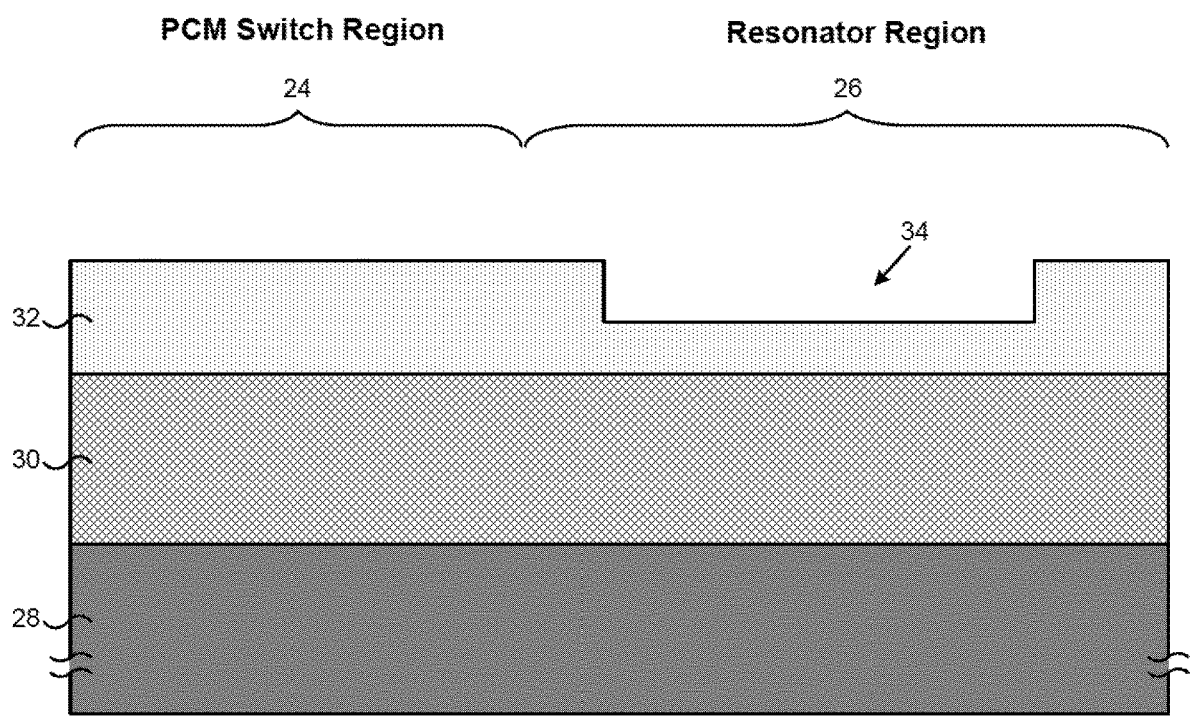
FIG. 2 illustrates a semiconductor structure processed in accordance with action 2 in the flowchart of FIG. 1A according to one implementation of the present application.
Figure 3:
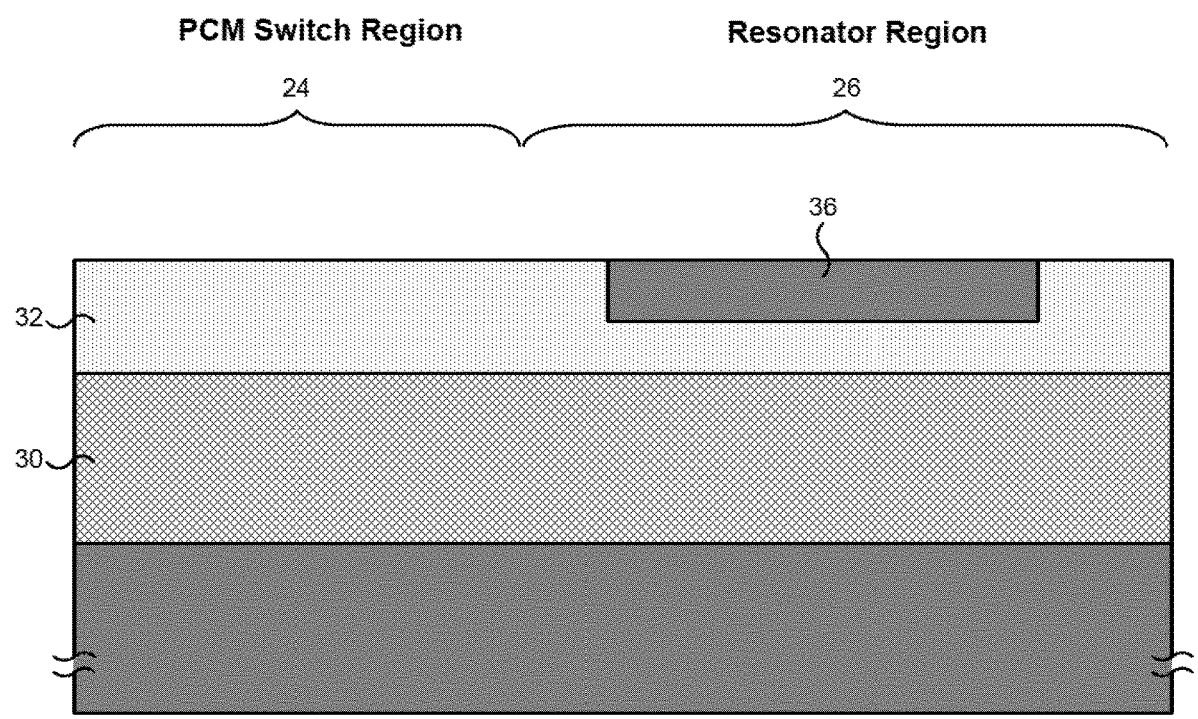
FIG. 3 illustrates a semiconductor structure processed in accordance with action 3 in the flowchart of FIG. 1A according to one implementation of the present application.
Figure 9:
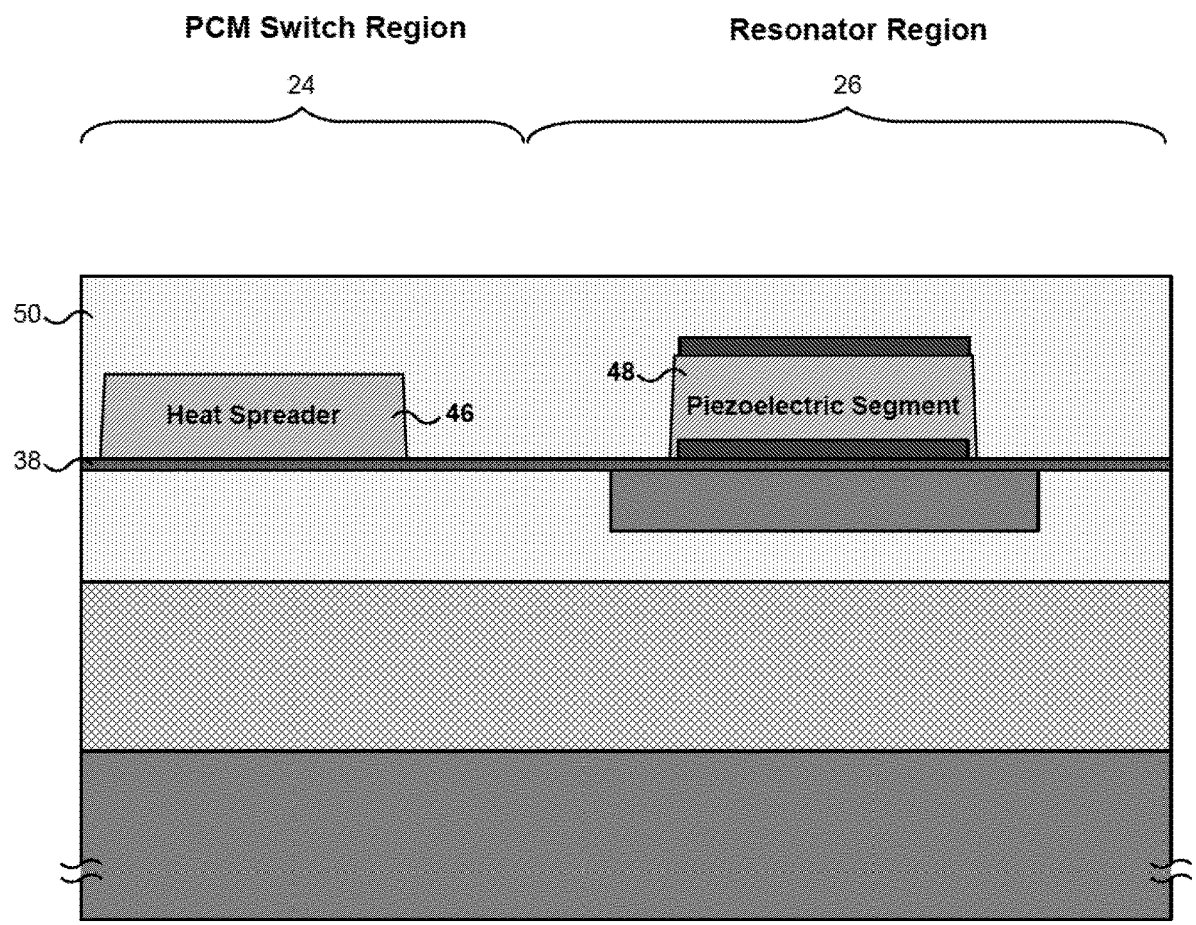
FIG. 9 illustrates a semiconductor structure processed in accordance with action 9 in the flowchart of FIG. 1B according to one implementation of the present application.
Figure 10:
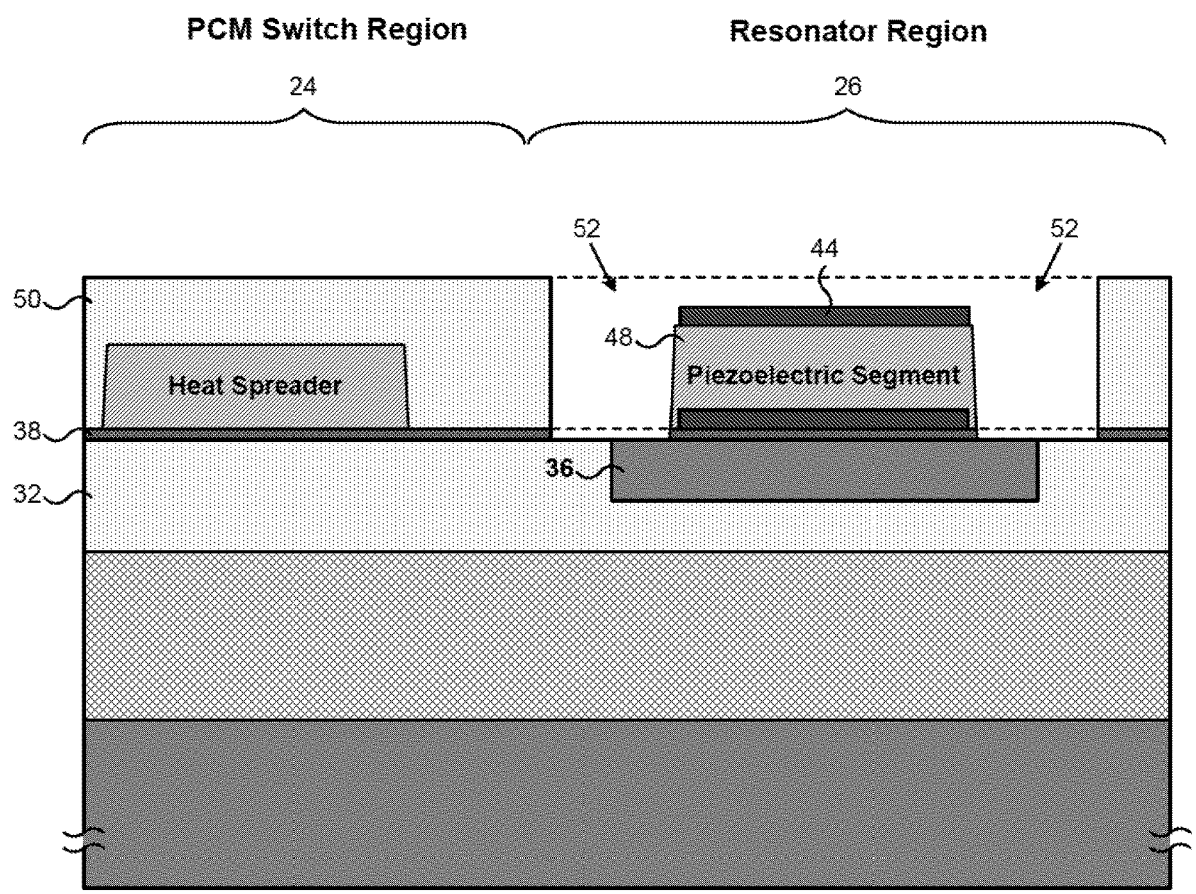
FIG. 10 illustrates a semiconductor structure processed in accordance with action 10 in the flowchart of FIG. 1B according to one implementation of the present application.

FIGS. 1A, 1B and 1C illustrate a flowchart of an exemplary method for manufacturing a semiconductor device having a phase change material (PCM) switch region and a resonator region by using a shared material, according to one implementation of the present application. Structures shown in FIGS. 2 through 8 illustrate the results of performing actions 2 through 8 shown in the flowchart of FIG. 1A. For example, FIG. 2 shows a semiconductor structure after performing action 2 in FIG. 1A, FIG. 3 shows a semiconductor structure after performing action 3 in FIG. 1A, and so forth. From action 8 in FIG. 1A, the method continues with action 9 in FIG. 1B. Structures shown in FIGS. 9 through 15 illustrate the results of performing actions 9 through 15 shown in the flowchart of FIG. 1B. For example, FIG. 9 shows a semiconductor structure after performing action 9 in FIG. 1B, FIG. 10 shows a semiconductor structure after performing action 10 in FIG. 1B, and so forth. From action 15 in FIG. 1B, the method continues with action 16 in FIG. 1C. Structures shown in FIGS. 16, 17, 18A, 19, 20, 21A, and 22 illustrate the results of performing actions 16 through 22 shown in the flowchart of FIG. 1C. For example, FIG. 16 shows a semiconductor structure after performing action 16 in FIG. 1C, FIG. 18A shows a semiconductor structure after performing action 18 in FIG. 1C, and so forth.

Actions 2 through 8 shown in the flowchart of FIG. 1A, actions 9 through 15 shown in the flowchart of FIG. 1B, and actions 16 through 22 shown in the flowchart of FIG. 1C are sufficient to describe one implementation of the present inventive concepts. Other implementations of the present inventive concepts may utilize actions different from those shown in the flowcharts of FIGS. 1A, 1B, and 1C. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 2 illustrates a semiconductor structure processed in accordance with action 2 in the flowchart of FIG. 1A according to one implementation of the present application. As shown in FIG. 2, the semiconductor structure has phase-change material (PCM) switch region 24 and resonator region 26, and includes substrate 28, back-end-of-line multi-level metallization (BEOL MLM) 30, and first dielectric layer 32.

In various implementations, substrate 28 is a silicon (Si), germanium (Ge), silicon germanium ($Si_XGe_Y$), silicon carbide ($Si_XC_Y$), or group III-V substrate. BEOL MLM 30 is situated over substrate 28. BEOL MLM 30 is generally any multi-layer stack of interconnect metals and interlayer dielectrics suitable for semiconductor devices. BEOL MLM 30 can comprise a plurality of interconnect metal levels and interlayer dielectric layers. BEOL MLM 30 can also comprise a plurality of devices, such as integrated passive devices (not shown in FIG. 2).

First dielectric layer 32 is situated over BEOL MLM 30. In various implementations, first dielectric layer 32 can comprise silicon oxide ($Si_XO_Y$), silicon nitride ($Si_XN_Y$), or another dielectric. As shown in FIG. 2, in accordance with action 2 in FIG. 1A, first trench 34 is etched in resonator region 26 in first dielectric layer 32. In one implementation, first trench 34 can have a depth of approximately one half a micron to approximately two microns (0.5 µm-2 µm).

FIG. 3 illustrates a semiconductor structure processed in accordance with action 3 in the flowchart of FIG. 1A according to one implementation of the present application. As shown in FIG. 3, the semiconductor structure has PCM switch region 24 and resonator region 26, and first sacrificial material 36 is formed in resonator region 26 in first trench 34 (shown in FIG. 2). In the present implementation, the top surface of first sacrificial material 36 is coplanar with the top surface of first dielectric layer 32. First sacrificial material 36 can be formed, for example, using low pressure chemical vapor deposition (LPCVD) followed by chemical machine polishing (CMP). Low-temperature processes may be used to form first sacrificial material 36 without damaging metallization structures formed in BEOL MLM 30. However, any other method known in the art can be used to form first sacrificial material 36. In various implementations, first sacrificial material 36 can comprise silicon, polyamide, or another sacrificial material. In one implementation, the top surface of first sacrificial material 36 is not coplanar with the top surface of first dielectric layer 32. For example, first trench 34 (shown in FIG. 2) is not used, and first sacrificial material 36 is formed over first dielectric layer 32.

Figure 4:
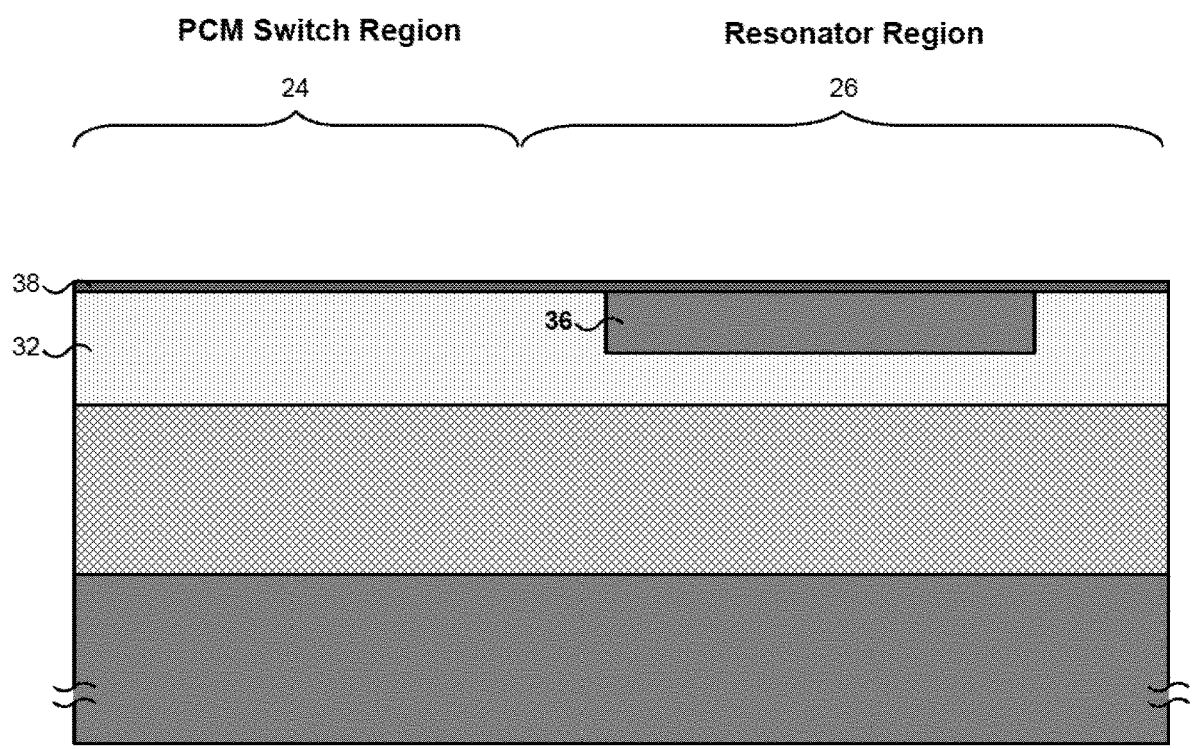
FIG. 4 illustrates a semiconductor structure processed in accordance with action 4 in the flowchart of FIG. 1A according to one implementation of the present application.

FIG. 4 illustrates a semiconductor structure processed in accordance with action 4 in the flowchart of FIG. 1A according to one implementation of the present application. As shown in FIG. 4, the semiconductor structure has PCM switch region 24 and resonator region 26, and membrane layer 38 is formed over first sacrificial material 36 and over first dielectric layer 32. In various implementations, membrane layer 38 can comprise silicon oxide ($Si_XO_Y$), silicon nitride ($Si_XN_Y$), or another dielectric. In one implementation, membrane layer 38 can have a thickness of approximately fifty angstroms to approximately one thousand angstroms (50 Å-1000 Å).

Figure 5:
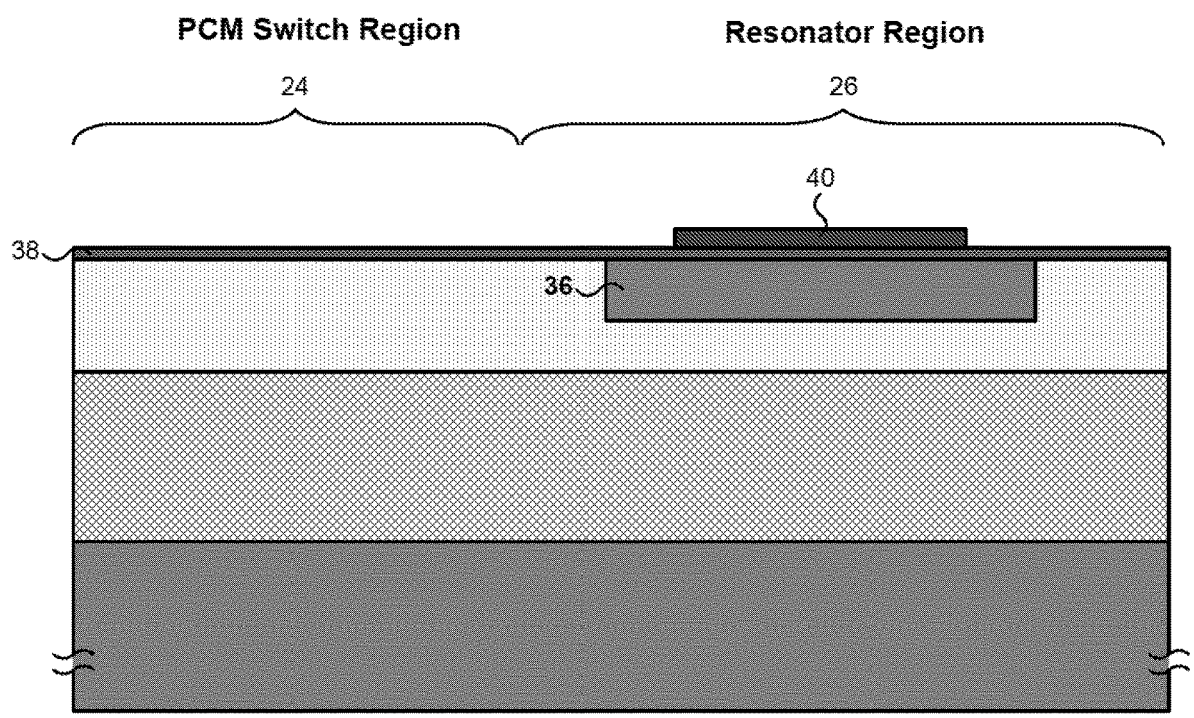
FIG. 5 illustrates a semiconductor structure processed in accordance with action 5 in the flowchart of FIG. 1A according to one implementation of the present application.

FIG. 5 illustrates a semiconductor structure processed in accordance with action 5 in the flowchart of FIG. 1A according to one implementation of the present application. As shown in FIG. 5, the semiconductor structure has PCM switch region 24 and resonator region 26, and bottom electrode 40 is formed in resonator region 26. Bottom electrode 40 is formed over membrane layer 38, and overlying first sacrificial material 36. In various implementations, bottom electrode 40 can comprise aluminum (Al), tungsten (W), molybdenum (Mo), or platinum (Pt). In one implementation, bottom electrode 40 can have a thickness of approximately five hundred angstroms to approximately two thousand angstroms (500 Å-2000 Å).

Figure 6:
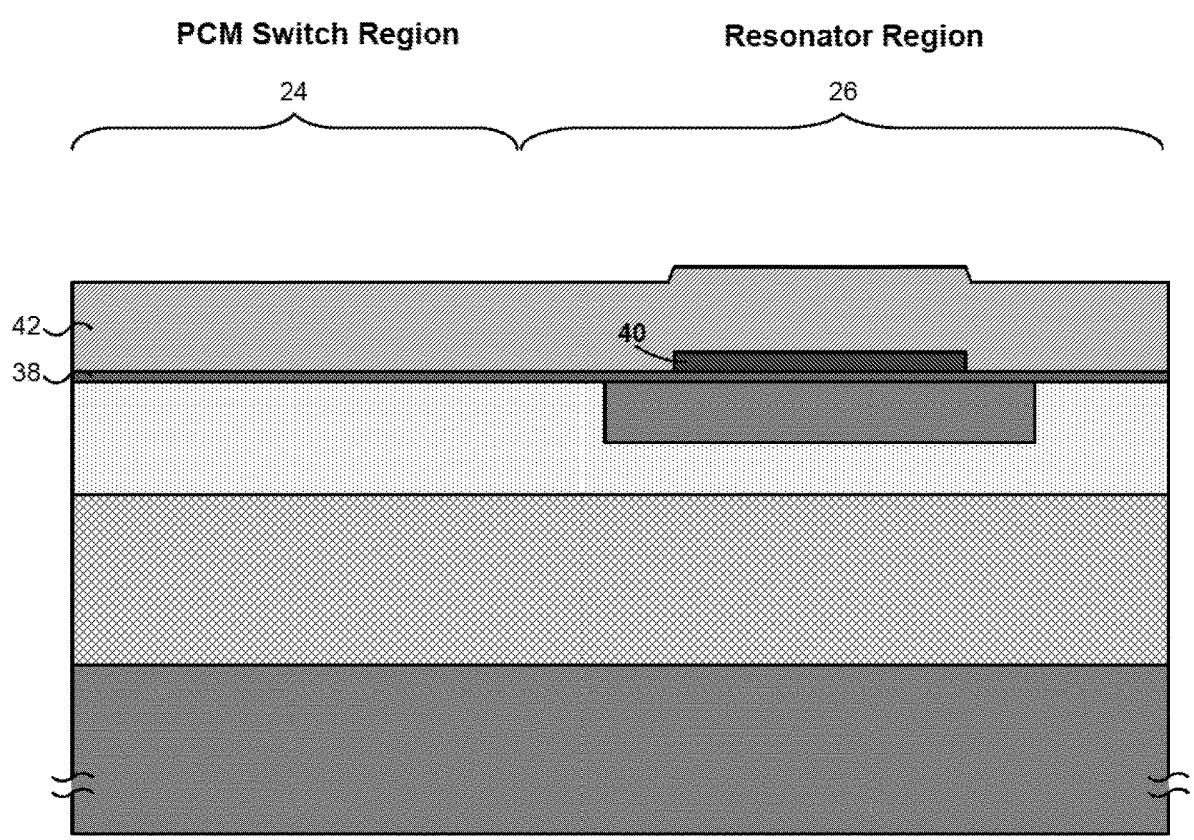
FIG. 6 illustrates a semiconductor structure processed in accordance with action 6 in the flowchart of FIG. 1A according to one implementation of the present application.

FIG. 6 illustrates a semiconductor structure processed in accordance with action 6 in the flowchart of FIG. 1A according to one implementation of the present application. As shown in FIG. 6, the semiconductor structure has PCM switch region 24 and resonator region 26, and shared material 42 is formed in both PCM switch region 24 and resonator region 26. Shared material 42 is formed over bottom electrode 40 and over membrane layer 38. Shared material 42 can comprise any material having high thermal conductivity and exhibiting a piezoelectric effect. In one implementation, shared material 42 can comprise aluminum nitride ($Al_xN_y$), and can have thermal conductivity ranging from approximately thirty five watts per meter-kelvin to approximately one hundred and twenty watts per meter-kelvin (35 W/(m·K)-120 W/(m·K)). Shared material 42 can be formed, for example, using physical vapor deposition (PVD). In one implementation, shared material 42 can have a thickness of approximately one half a micron to approximately three microns (0.5 µm-3 µm).

Figure 7:
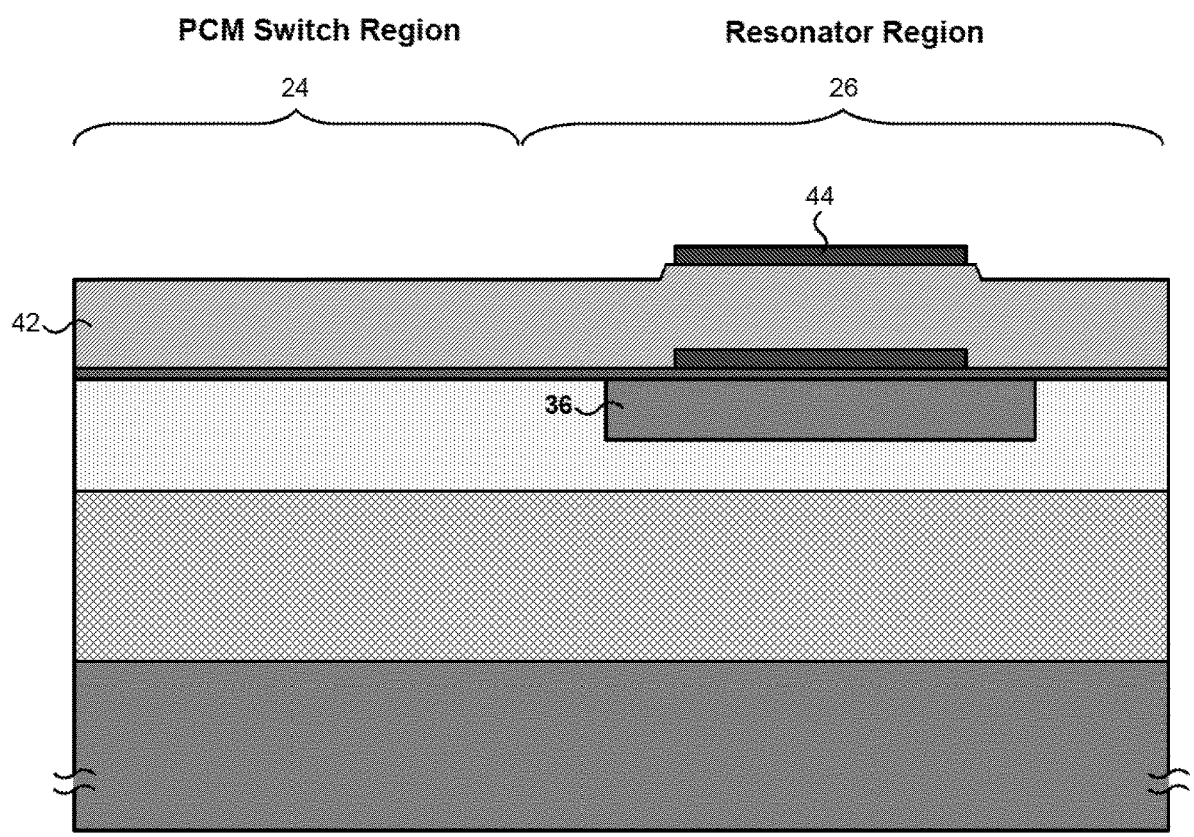
FIG. 7 illustrates a semiconductor structure processed in accordance with action 7 in the flowchart of FIG. 1A according to one implementation of the present application.

FIG. 7 illustrates a semiconductor structure processed in accordance with action 7 in the flowchart of FIG. 1A according to one implementation of the present application. As shown in FIG. 7, the semiconductor structure has PCM switch region 24 and resonator region 26, and top electrode 44 is formed in resonator region 26. Top electrode 44 is formed over shared material 42, and overlying first sacrificial material 36. In various implementations, top electrode 44 can comprise Al, W, Mo, or Pt. In one implementation, top electrode 44 can have a thickness of approximately five hundred angstroms to approximately two thousand angstroms (500 Å-2000 Å).

Figure 8:
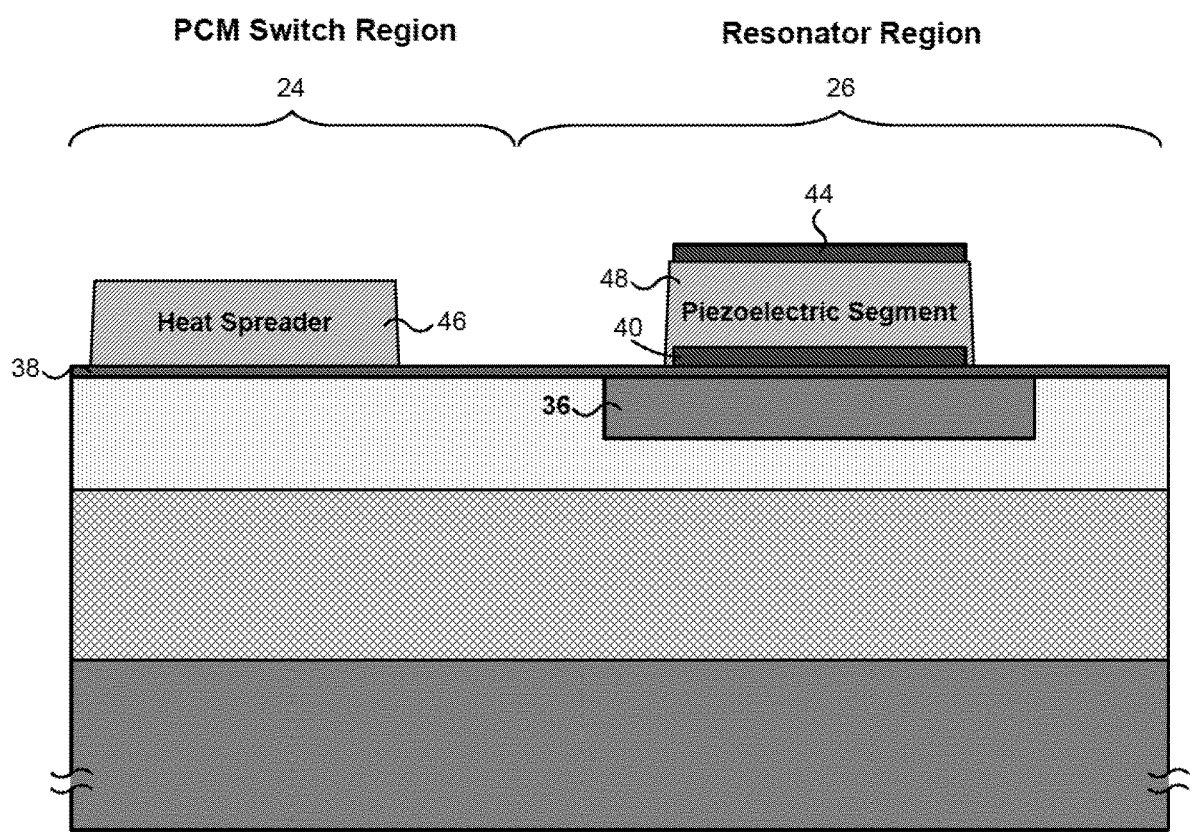
FIG. 8 illustrates a semiconductor structure processed in accordance with action 8 in the flowchart of FIG. 1A according to one implementation of the present application.

FIG. 8 illustrates a semiconductor structure processed in accordance with action 8 in the flowchart of FIG. 1A according to one implementation of the present application. As shown in FIG. 8, the semiconductor structure has PCM switch region 24 and resonator region 26, and portions of shared material 42 (labeled in FIG. 7) are removed, thereby concurrently forming heat spreader 46 in PCM switch region 24 and piezoelectric segment 48 in resonator region 26. Portions of shared material 42 (labeled in FIG. 7) can be removed, for example, using a chlorine based reactive ion etch (RIE) selective to shared material 42 (labeled in FIG. 7) over membrane layer 38. Piezoelectric segment 48 is situated between bottom electrode 40 and top electrode 44. Piezoelectric segment 48 also overlies first sacrificial material 36, with first sacrificial material 36 being wider than piezoelectric segment 48. As described below, in a final semiconductor device, piezoelectric segment 48 in resonator region 26 can act, for example, as a filter or oscillator resonating at a desired frequency, and heat spreader 46 in PCM switch region 24 dissipates heat generated by a PCM radio frequency (RF) switch.

Notably, after removing portions of shared material 42 (labeled in FIG. 7), heat spreader 46 in PCM switch region 24 and piezoelectric segment 48 in resonator region 26 are separated, but situated at substantially the same level in the semiconductor structure of FIG. 8. As used herein, "substantially the same level" refers to being at approximately the same height from the substrate, accounting for minor differences in thicknesses and topologies of layers underlying heat spreader 46 and/or piezoelectric segment 48, such as bottom electrode 40 in the present implementation, or such as a first sacrificial material, a membrane layer, or a Bragg reflector in an alternative implementation.

FIG. 9 illustrates a semiconductor structure processed in accordance with action 9 in the flowchart of FIG. 1B according to one implementation of the present application. As shown in FIG. 9, the semiconductor structure has PCM switch region 24 and resonator region 26, and second dielectric layer 50 is formed covering heat spreader 46, piezoelectric segment 48, and membrane layer 38. In various implementations, second dielectric layer 50 can be formed, for example, by depositing and polishing $Si_xO_y$, $Si_xN_y$, or another dielectric. In one implementation, second dielectric layer 50 can have a thickness of approximately three thousand angstroms to approximately five thousand angstroms (3000 Å-5000 Å).

FIG. 10 illustrates a semiconductor structure processed in accordance with action 10 in the flowchart of FIG. 1B according to one implementation of the present application. As shown in FIG. 10, second trench 52 is etched in resonator region 26, in second dielectric layer 50 and in membrane layer 38. Second trench 52 extends to first sacrificial material 36 in first dielectric layer 32, and exposes portions of top electrode 44, piezoelectric segment 48, and membrane layer 38. It is noted that FIG. 10 illustrates a cross-sectional view of a semiconductor structure. In another plane (not shown in FIG. 10), second dielectric layer 50 may still be situated against top electrode 44 and piezoelectric segment 48, and membrane layer 38 may still be unetched. Membrane layer 38 and second dielectric layer 50 are illustrated with dashed lines to indicate the still remaining portions that do not lie in the cross-sectional plane of FIG. 10. In one implementation, second trench 52 can have a depth of approximately one half a micron to approximately three microns (0.5 µm-3 µm). In one implementation, second trench 52 can extend partially into first sacrificial material 36 in first dielectric layer 32.

Figure 11:
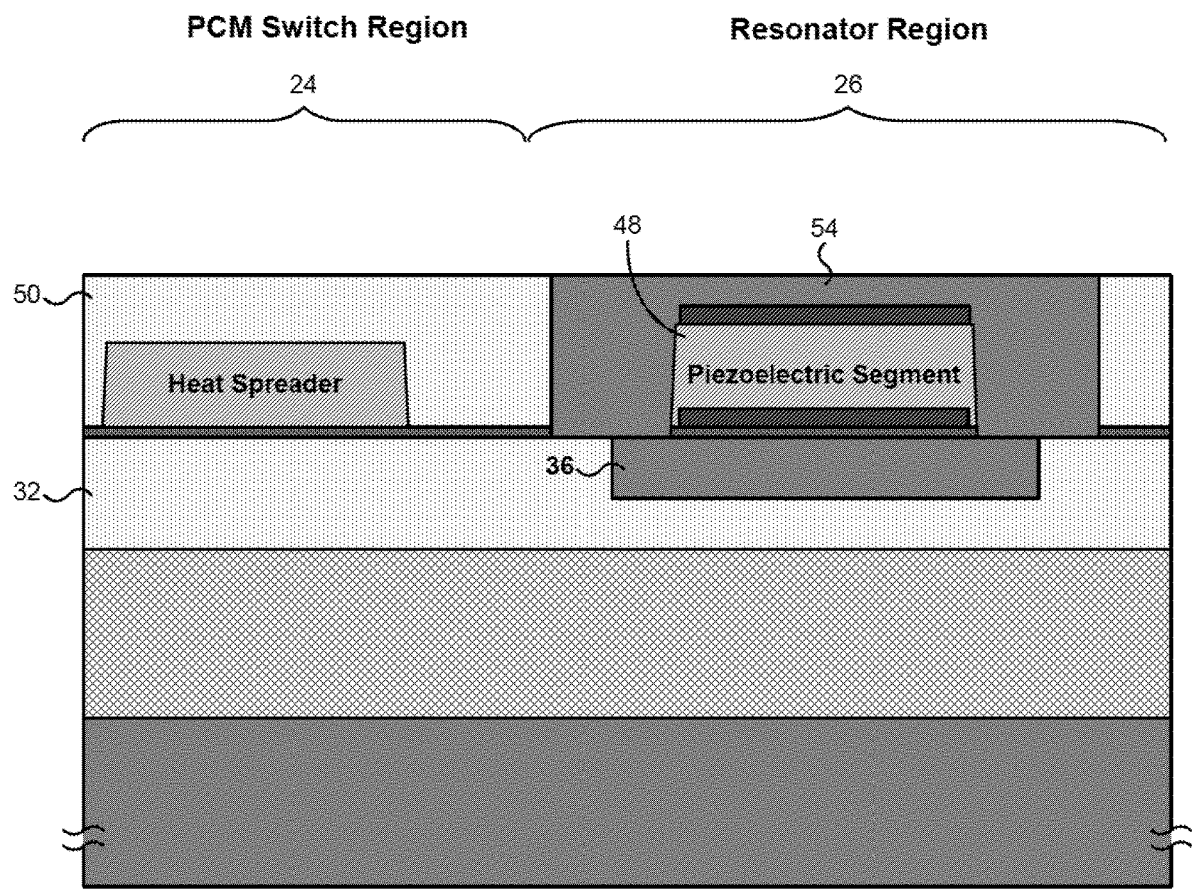
FIG. 11 illustrates a semiconductor structure processed in accordance with action 11 in the flowchart of FIG. 1B according to one implementation of the present application.

FIG. 11 illustrates a semiconductor structure processed in accordance with action 11 in the flowchart of FIG. 1B according to one implementation of the present application. As shown in FIG. 11, the semiconductor structure has PCM switch region 24 and resonator region 26, and second sacrificial material 54 is formed in resonator region 26 in second trench 52 (shown in FIG. 10). Second sacrificial material 54 extends to first sacrificial material 36 in first dielectric layer 32. As described below, in a final semiconductor device, first sacrificial material 36 and second sacrificial material 54 form the boundaries of a cavity of a resonator. In the present implementation, the top surface of second sacrificial material 54 is coplanar with the top surface of second dielectric layer 50. Second sacrificial material 54 can be formed, for example, using LPCVD followed by CMP. In various implementations, second sacrificial material 54 can comprise silicon, polyamide, or another sacrificial material.

Figure 12:
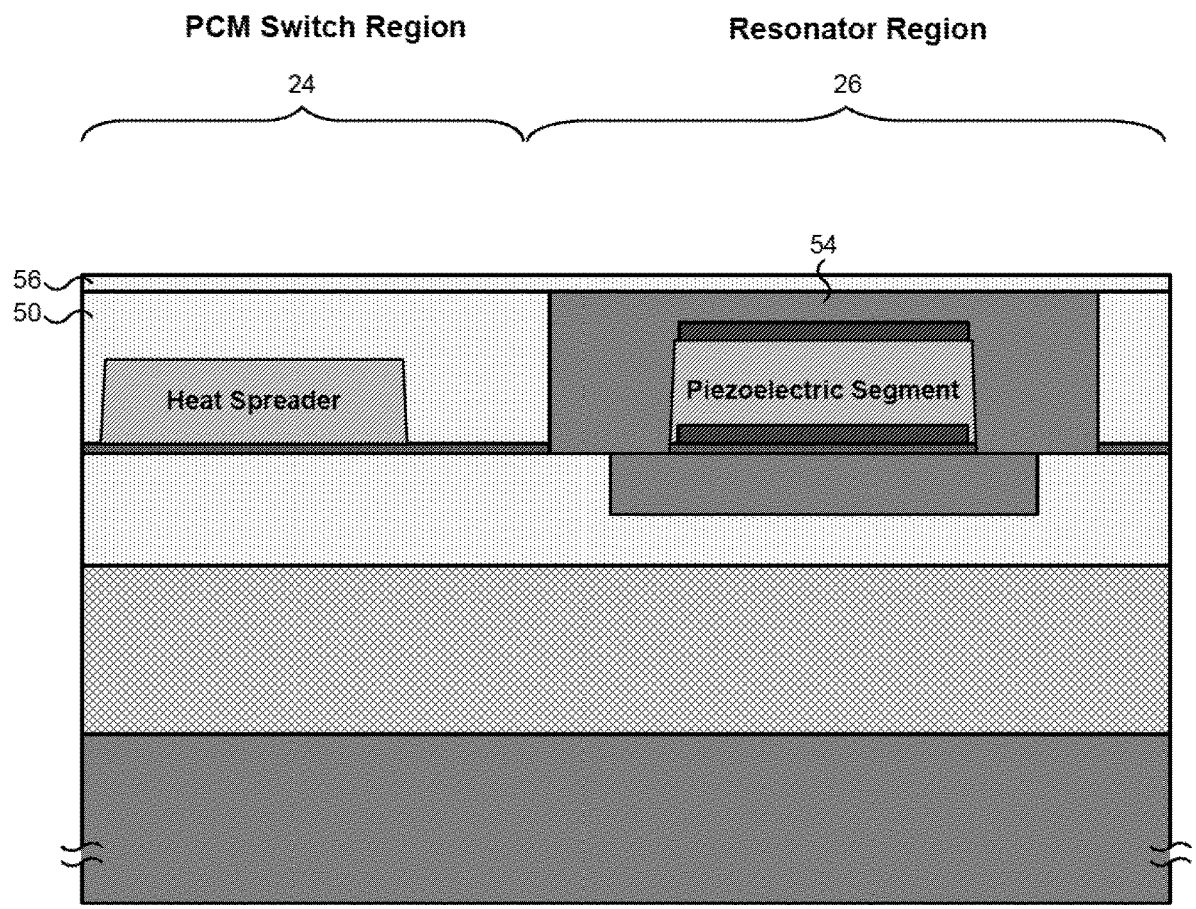
FIG. 12 illustrates a semiconductor structure processed in accordance with action 12 in the flowchart of FIG. 1B according to one implementation of the present application.

FIG. 12 illustrates a semiconductor structure processed in accordance with action 12 in the flowchart of FIG. 1B according to one implementation of the present application. As shown in FIG. 12, the semiconductor structure has PCM switch region 24 and resonator region 26, and third dielectric layer 56 is formed covering second sacrificial material 54 and second dielectric layer 50. In various implementations, third dielectric layer 56 can be formed, for example, by depositing and polishing $Si_XO_Y$, $Si_XN_Y$, or another dielectric. In one implementation, third dielectric layer 56 can have a thickness of approximately one thousand angstroms to approximately two thousand angstroms (1000 Å-2000 Å).

Figure 13:
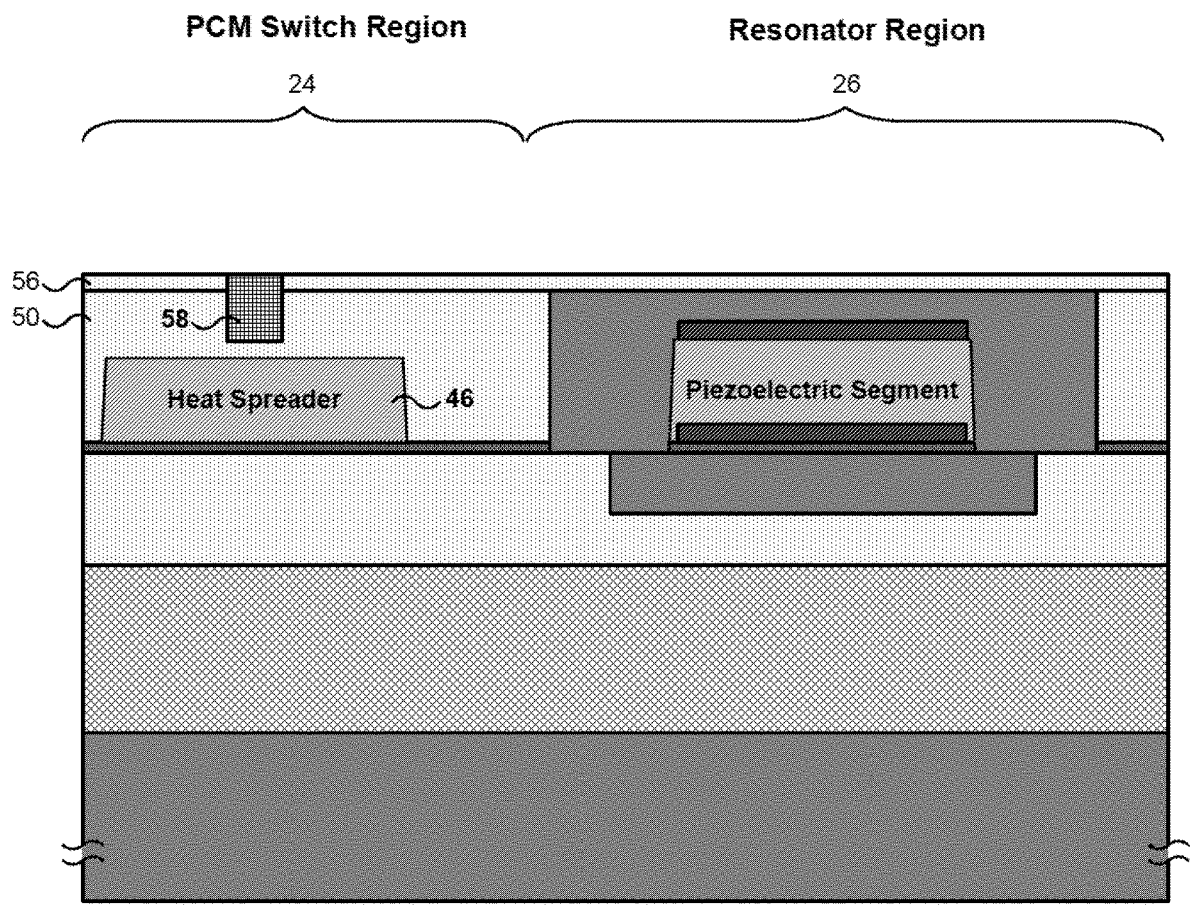
FIG. 13 illustrates a semiconductor structure processed in accordance with action 13 in the flowchart of FIG. 1B according to one implementation of the present application.

FIG. 13 illustrates a semiconductor structure processed in accordance with action 13 in the flowchart of FIG. 1B according to one implementation of the present application. As shown in FIG. 13, the semiconductor structure has PCM switch region 24 and resonator region 26, and heating element 58 is formed in PCM switch region 24 overlying heat spreader 46. Heating element 58 can be formed, for example, using a damascene process by etching through third dielectric layer 56 and partially through second dielectric layer 50, and forming a metal therein. In one implementation, heat spreader 46 and heating element 58 are separated by approximately one hundred angstroms to approximately one thousand angstroms (100 Å-1000 Å).

Heating element 58 can comprise any material capable of Joule heating. Preferably, heating element 58 comprises a material that exhibits minimal or substantially no electromigration, thermal stress migration, and/or agglomeration. In various implementations, heating element 58 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi). For example, in one implementation, heating element 58 comprises tungsten lined with titanium and titanium nitride.

Figure 14:
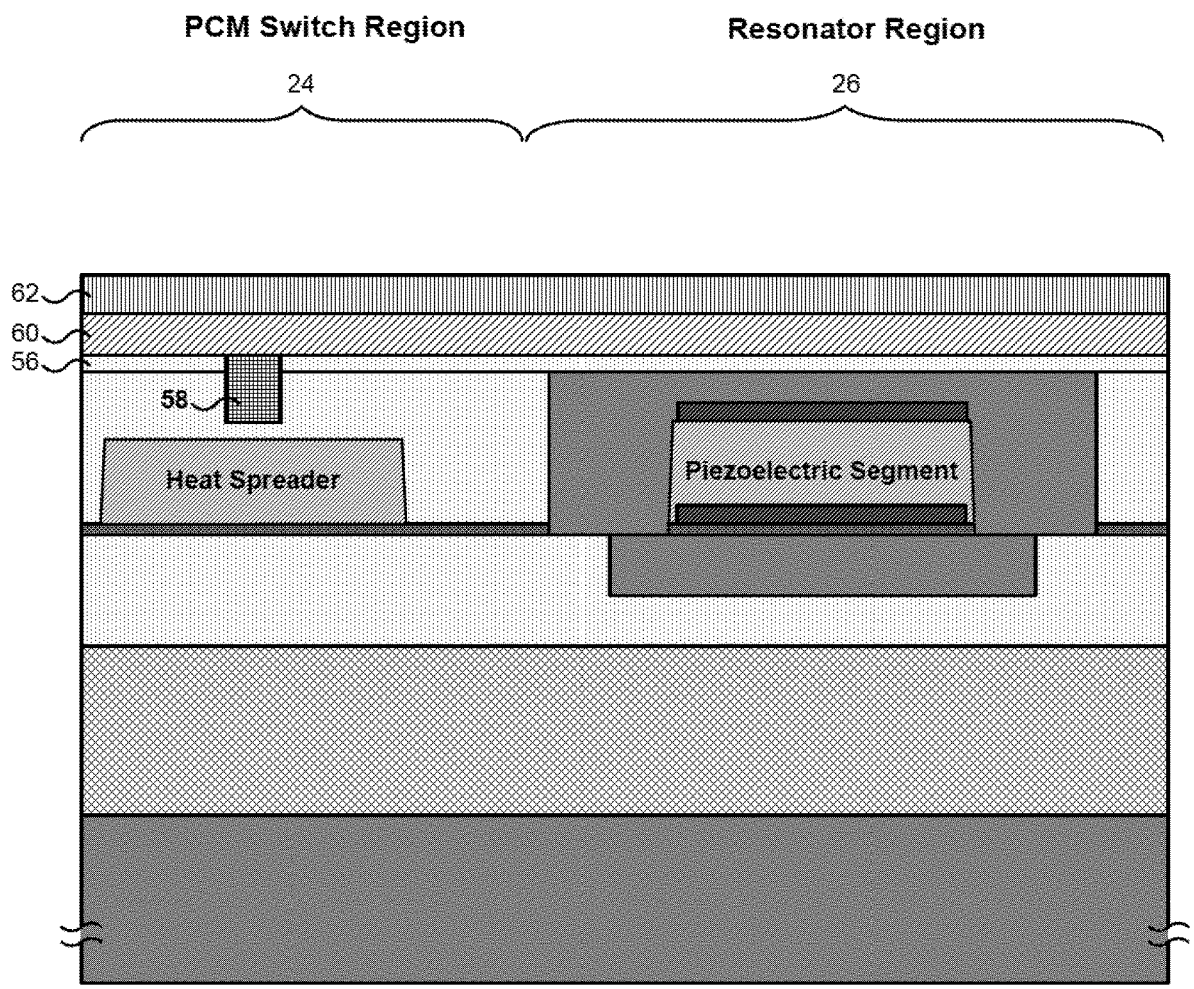
FIG. 14 illustrates a semiconductor structure processed in accordance with action 14 in the flowchart of FIG. 1B according to one implementation of the present application.

FIG. 14 illustrates a semiconductor structure processed in accordance with action 14 in the flowchart of FIG. 1B according to one implementation of the present application. As shown in FIG. 14, the semiconductor structure has PCM switch region 24 and resonator region 26. Thermally conductive and electrically insulating material 60 is formed over heating element 58 and third dielectric layer 56, and PCM 62 is formed over thermally conductive and electrically insulating material 60.

Thermally conductive and electrically insulating material 60 can comprise any material with high thermal conductivity and high electrical resistivity. In various implementations, thermally conductive and electrically insulating material 60 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating material 60 can have a thickness of approximately five hundred angstroms to approximately three thousand angstroms (500 Å-3000 Å).

PCM 62 can comprise germanium telluride ($Ge_XTe_Y$), germanium antimony telluride ($Ge_XSb_Y Te_Z$), germanium selenide ($Ge_XSe_Y$), or any other chalcogenide. In various implementations. PCM 62 can be germanium telluride having from forty percent to sixty percent germanium by composition (i.e., $Ge_XTe_Y$, where $0.4<X<0.6$ and $Y=1-X$). The material for PCM 62 can be chosen based upon ON state resistivity, OFF state electric field breakdown voltage, crystallization temperature, melting temperature, or other considerations. In one implementation, PCM 62 can have a thickness of approximately five hundred angstroms to approximately one thousand and five hundred angstroms (500 Å-1500 Å).

Figure 15:
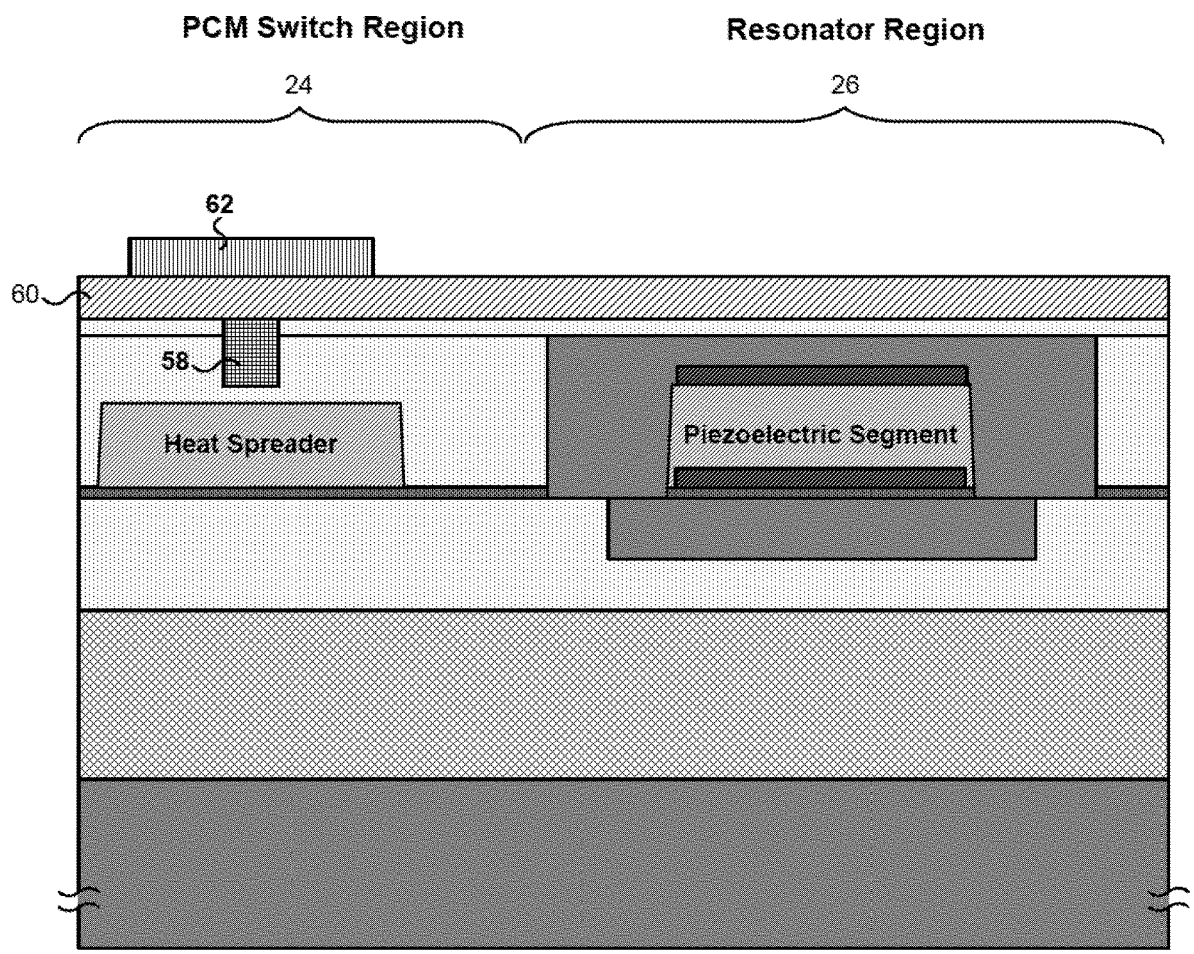
FIG. 15 illustrates a semiconductor structure processed in accordance with action 15 in the flowchart of FIG. 1B according to one implementation of the present application.
Figure 16:
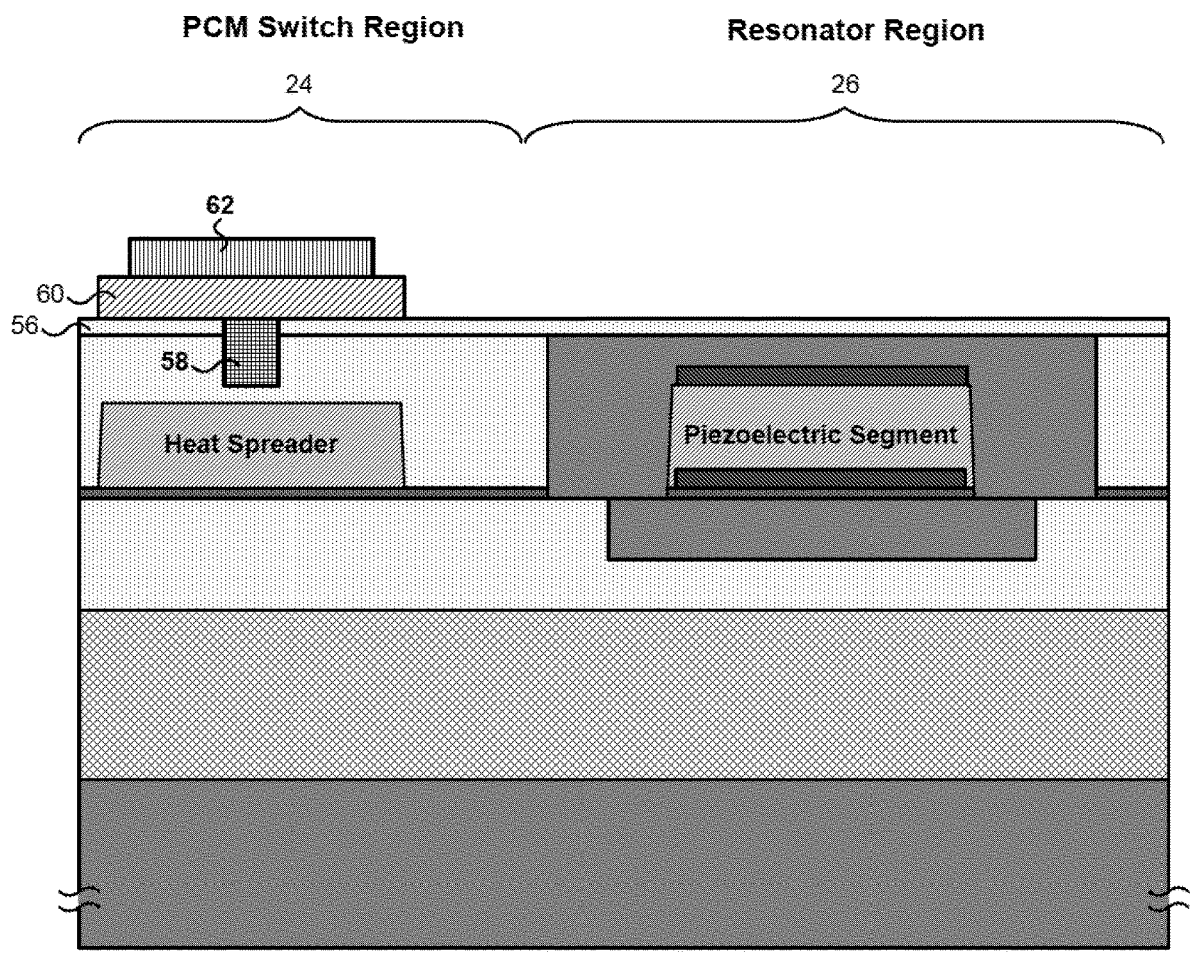
FIG. 16 illustrates a semiconductor structure processed in accordance with action 16 in the flowchart of FIG. 1C according to one implementation of the present application.

FIG. 15 illustrates a semiconductor structure processed in accordance with action 15 in the flowchart of FIG. 1B according to one implementation of the present application. As shown in FIG. 15, the semiconductor structure has PCM switch region 24 and resonator region 26, and PCM 62 is patterned. PCM 62 can be patterned, for example, using a fluorine based RIE selective to PCM 62 over thermally conductive and electrically insulating material 60. After patterning, PCM 62 is situated in PCM switch region 24 overlying heating element 58, with PCM 62 being wider than heating element 58.

FIG. 16 illustrates a semiconductor structure processed in accordance with action 16 in the flowchart of FIG. 1C according to one implementation of the present application. As shown in FIG. 16, the semiconductor structure has PCM switch region 24 and resonator region 26, and thermally conductive and electrically insulating material 60 is patterned. Thermally conductive and electrically insulating material 60 can be patterned, for example, using a chlorine based RIE selective to thermally conductive and electrically insulating material 60 over third dielectric layer 56. After patterning, thermally conductive and electrically insulating material 60 is situated in PCM switch region 24, between heating element 58 and PCM 62.

Figure 17:
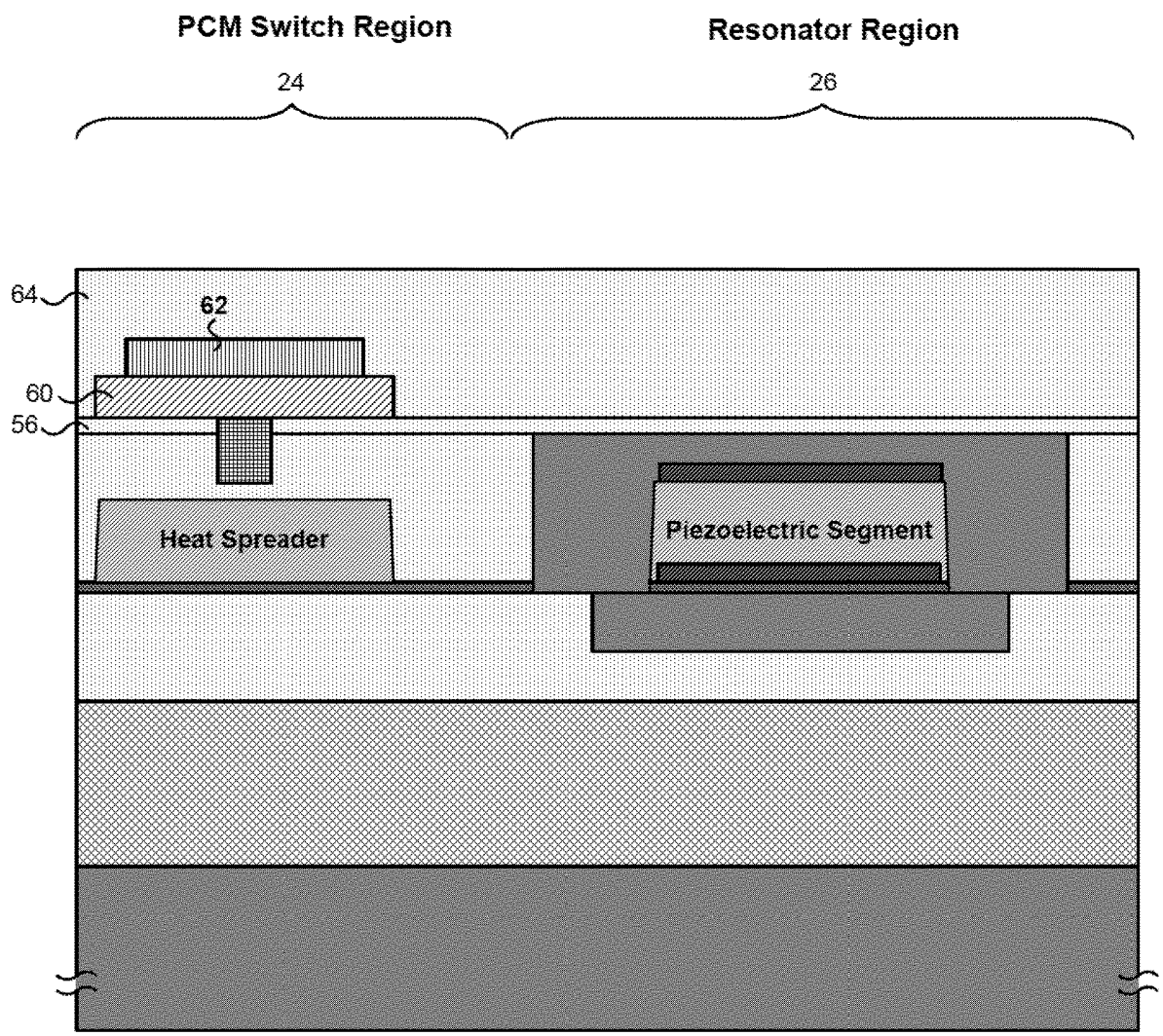
FIG. 17 illustrates a semiconductor structure processed in accordance with action 17 in the flowchart of FIG. 1C according to one implementation of the present application.
Figure 18A:
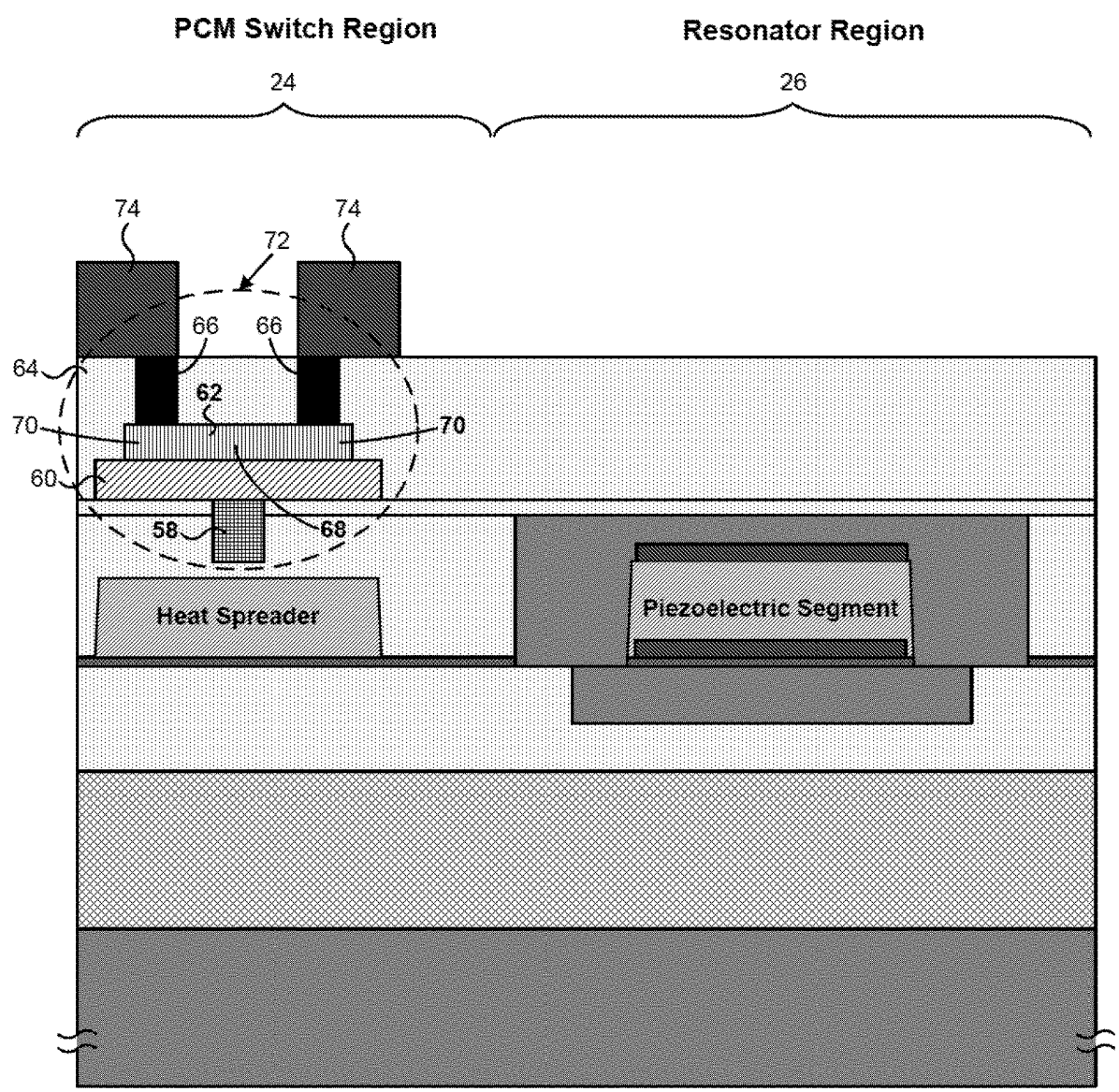
FIG. 18A illustrates a semiconductor structure processed in accordance with action 18 in the flowchart of FIG. 1C according to one implementation of the present application.

FIG. 17 illustrates a semiconductor structure processed in accordance with action 17 in the flowchart of FIG. 1C according to one implementation of the present application. As shown in FIG. 17, the semiconductor structure has PCM switch region 24 and resonator region 26, and fourth dielectric layer 64 is formed covering PCM 62, thermally conductive and electrically insulating material 60, and third dielectric layer 56. In various implementations, fourth dielectric layer 64 is silicon dioxide ($SiO_2$), boron-doped $SiO_2$, phosphorous-doped $SiO_2$, $Si_XN_Y$, or another dielectric. In various implementations, fourth dielectric layer 64 is a low-k dielectric, such as fluorinated silicon dioxide, carbon-doped silicon oxide, or spin-on organic polymer. Fourth dielectric layer 64 can be provided, for example, by plasma enhanced CVD (PECVD), high density plasma CVD (HDP-CVD), or spin-on processes. In one implementation, fourth dielectric layer 64 can have a thickness of approximately 3000 Angstroms to approximately 1 micron (1 μm).

FIG. 18A illustrates a semiconductor structure processed in accordance with action 18 in the flowchart of FIG. 1C according to one implementation of the present application. As shown in FIG. 18A, the semiconductor structure has PCM switch region 24 and resonator region 26, and PCM contacts 66 are formed. PCM contacts extend partially through fourth dielectric layer 64, and are connected to passive segments 70 of PCM 62. In various implementations, PCM contacts 66 can comprise tungsten (W), copper (Cu), aluminum (Al), titanium (Ti), titanium nitride (TiN), or tantalum (Ta). FIG. 18A also illustrates formation of interconnect metals 74 connected to PCM contacts 66. In various implementations, interconnect metals 74 can comprise Cu or Al. Although PCM contacts 66 and interconnect metals 74 are shown as distinct structures in FIG. 18A, in one implementation, PCM contacts 66 and interconnect metals 74 may be integrally formed. For example, a metal layer can be deposited in contact holes connected to passive segments 70 of PCM 62 as well as over fourth dielectric layer 64, and then patterned to concurrently form PCM contacts 66 and interconnect metals 74.

After forming PCM contacts 66 and/or interconnect metals 74, PCM RF switch 72 is substantially completed in PCM switch region 24. PCM RF switch 72 includes heating element 58, thermally conductive and electrically insulating material 60, PCM 62 having active segment 68 and passive segments 70, and PCM contacts 66. It is noted that in FIG. 18A, PCM 62 is transverse to heating element 58. Active segment 68 of PCM 62 is aligned with heating element 58 and approximately defined by heating element 58. Current flowing in heating element 58 flows substantially under active segment 68 of PCM 62. Additional details regarding PCM RF switch 72 are described below.

Figure 18B:
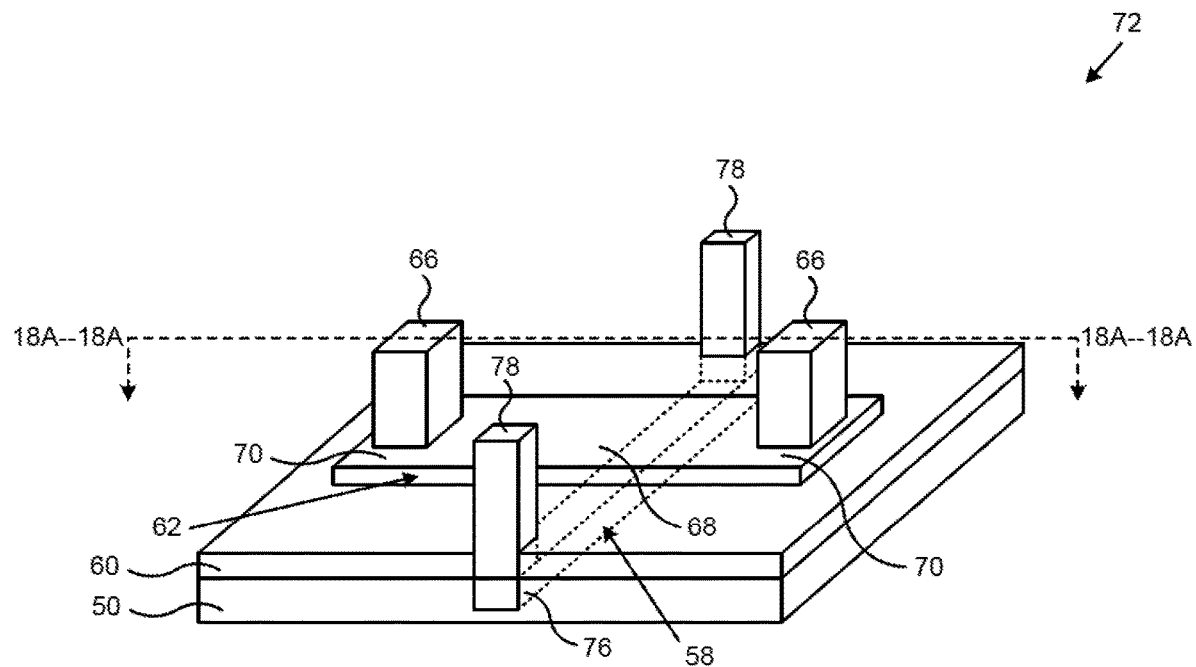
FIG. 18B illustrates a perspective view of a portion of a PCM RF switch according to one implementation of the present application.

FIG. 18B illustrates a perspective view of a portion of a PCM RF switch according to one implementation of the present application. PCM RF switch 72 in FIG. 18B generally corresponds to PCM RF switch 72 in FIG. 18A. FIG. 18A represents a cross-sectional view along plane "18A-18A" in FIG. 18B. As shown in FIG. 18B, PCM RF switch 72 includes second dielectric layer 50, heating element 58 having terminal segments 76, thermally conductive and electrically insulating material 60, PCM 62 having active segment 68 and passive segments 70, PCM contacts 66, and heater contacts 78. For purposes of illustration, the perspective view in FIG. 18B shows selected structures of PCM RF switch 72. PCM RF switch 72 may include other structures not shown in FIG. 18B.

Second dielectric layer 50 in PCM RF switch 72 is situated below thermally conductive and electrically insulating material 60. As shown in FIG. 18B, second dielectric layer 50 is also adjacent to sides of heating element 58. Second dielectric layer 50 extends along the width of PCM RF switch 72, and is also coplanar with the top of heating element 58. Because PCM RF switch 72 includes second dielectric layer 50 on the sides of heating element 58, less heat transfers horizontally (i.e., from the sides) and more heat dissipates vertically, from heating element 58 toward active segment 68 of PCM 62. In various implementations, second dielectric layer 50 can have a relative width and/or a relative thickness greater or less than shown in FIG. 18B. Second dielectric layer 50 can comprise any material with thermal conductivity lower than that of thermally conductive and electrically insulating material 60.

Heating element 58 in PCM RF switch 72 is situated in second dielectric layer 50. Heating element 58 is also aligned with active segment 68 of PCM 62. Heating element 58 generates a crystallizing heat pulse or an amorphizing heat pulse for transforming active segment 68 of PCM 62. As described above, heating element 58 can comprise any material capable of Joule heating. Heating element 58 can be connected to electrodes of a pulse generator (not shown in FIG. 18B) that generates crystallizing or amorphizing voltage or current pulses. Preferably, heating element 58 comprises a material that exhibits minimal or substantially no electromigration, thermal stress migration, and/or agglomeration.

Thermally conductive and electrically insulating material 60 in PCM RF switch 72 is situated on top of heating element 58 and second dielectric layer 50, and under PC M 62 and, in particular, under active segment 68 of PCM 62. Thermally conductive and electrically insulating material 60 ensures efficient heat transfer from heating element 58 toward active segment 68 of PCM 62, while electrically insulating heating element 58 from PCM contacts 66, PCM 62, and other neighboring structures.

As described above, thermally conductive and electrically insulating material 60 can comprise any material with high thermal conductivity and high electrical resistivity. In one implementation, thermally conductive and electrically insulating material 60 can be a nugget that does not extend along the width of PCM RF switch 72. For example, thermally conductive and electrically insulating material 60 can be a nugget approximately aligned with heating element 58.

PCM 62 in PCM RF switch 72 is situated on top of thermally conductive and electrically insulating material 60. PCM 62 includes active segment 68 and passive segments 70. Active segment 68 of PCM 62 is aligned with heating element 58 and is approximately defined by heating element 58. Passive segments 70 of PCM 62 extend outward and are transverse to heating element 58, and are situated approximately under PCM contacts 66. As used herein, "active segment" refers to a segment of PCM that transforms between crystalline and amorphous phases, for example, in response to a crystallizing or an amorphizing heat pulse generated by heating element 58, whereas "passive segment" refers to a segment of PCM that does not make such transformation and maintains a crystalline phase (i.e., maintains a conductive state).

With proper heat pulses and heat dissipation, active segment 68 of PCM 62 can transform between crystalline and amorphous phases, allowing PCM RF switch 72 to switch between ON and OFF states respectively. Active segment 68 of PCM 62 must be heated and rapidly quenched in order for PCM RF switch 72 to switch states. If active segment 68 of PCM 62 does not quench rapidly enough, it will not transform and PCM RF switch 72 will fail to switch states. How rapidly active segment 68 of PCM 62 must be quenched depends on the material, volume, and temperature of PCM 62. In one implementation, the quench time window can be approximately one hundred nanoseconds (100 ns) or greater or less.

As described above, PCM 62 can comprise any chalcogenide, and the material for PCM 62 can be chosen based upon ON state resistivity, OFF state electric field breakdown voltage, crystallization temperature, melting temperature, or other considerations. It is noted that in FIG. 18B, heating element 58 is transverse to PCM 62. Heating element 58 is illustrated with dashed lines as seen through various structures of PCM RF switch 72. Current flowing in heating element 58 flows substantially under active segment 68 of PCM 62.

PCM contacts 66 in PCM RF switch 72 are connected to passive segments 70 of PCM 62. Similarly, heater contacts 78 are connected to terminal segments 76 of heating element 58. PCM contacts 66 provide RF signals to and from PCM 62. Heater contacts 78 provide power to heating element 58 for generating a crystallizing heat pulse or an amorphizing heat pulse. PCM contacts 66 and heater contacts 78 can extend through various dielectric layers (not shown in FIG. 18B). In various implementations, PCM contacts 66 and heater contacts 78 can comprise tungsten (W), copper (Cu), aluminum (Al), titanium (Ti), titanium nitride (TiN), or tantalum (Ta).

Figure 19:
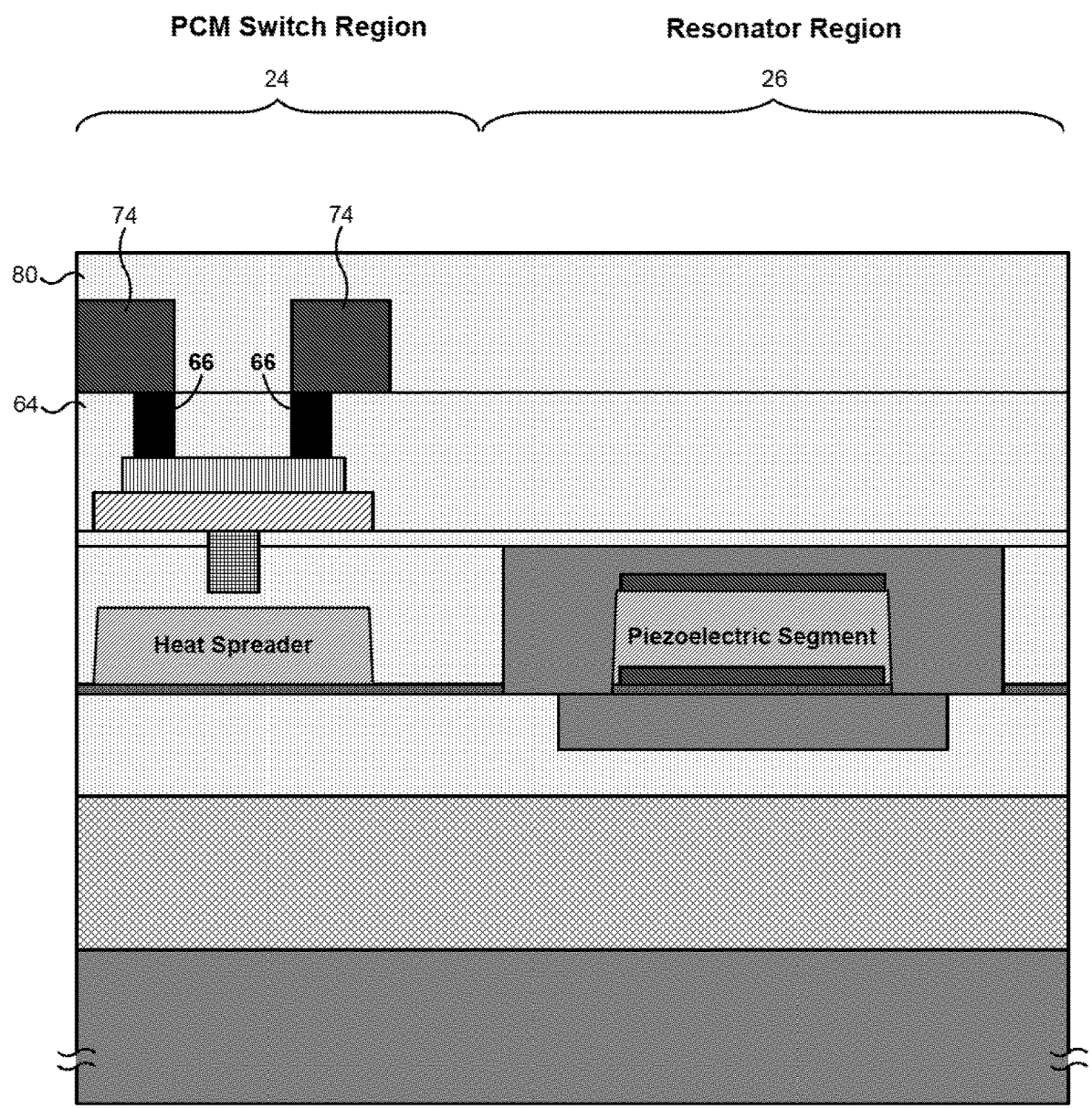
FIG. 19 illustrates a semiconductor structure processed in accordance with action 19 in the flowchart of FIG. 1C according to one implementation of the present application.

FIG. 19 illustrates a semiconductor structure processed in accordance with action 19 in the flowchart of FIG. 1C according to one implementation of the present application. As shown in FIG. 19, the semiconductor structure has PCM switch region 24 and resonator region 26, and fifth dielectric layer 80 is formed covering PCM contacts 66, interconnect metals 74, and fourth dielectric layer 64. In various implementations, fifth dielectric layer 80 is silicon dioxide ($SiO_2$), boron-doped $SiO_2$, phosphorous-doped $SiO_2$, $Si_xN_y$, or another dielectric. Although not illustrated in FIG. 19, in various implementations, the semiconductor structure can have additional interconnect metal levels and dielectric layers, including any number of vias and additional interconnect metals, situated above interconnect metal 74.

Figure 20:
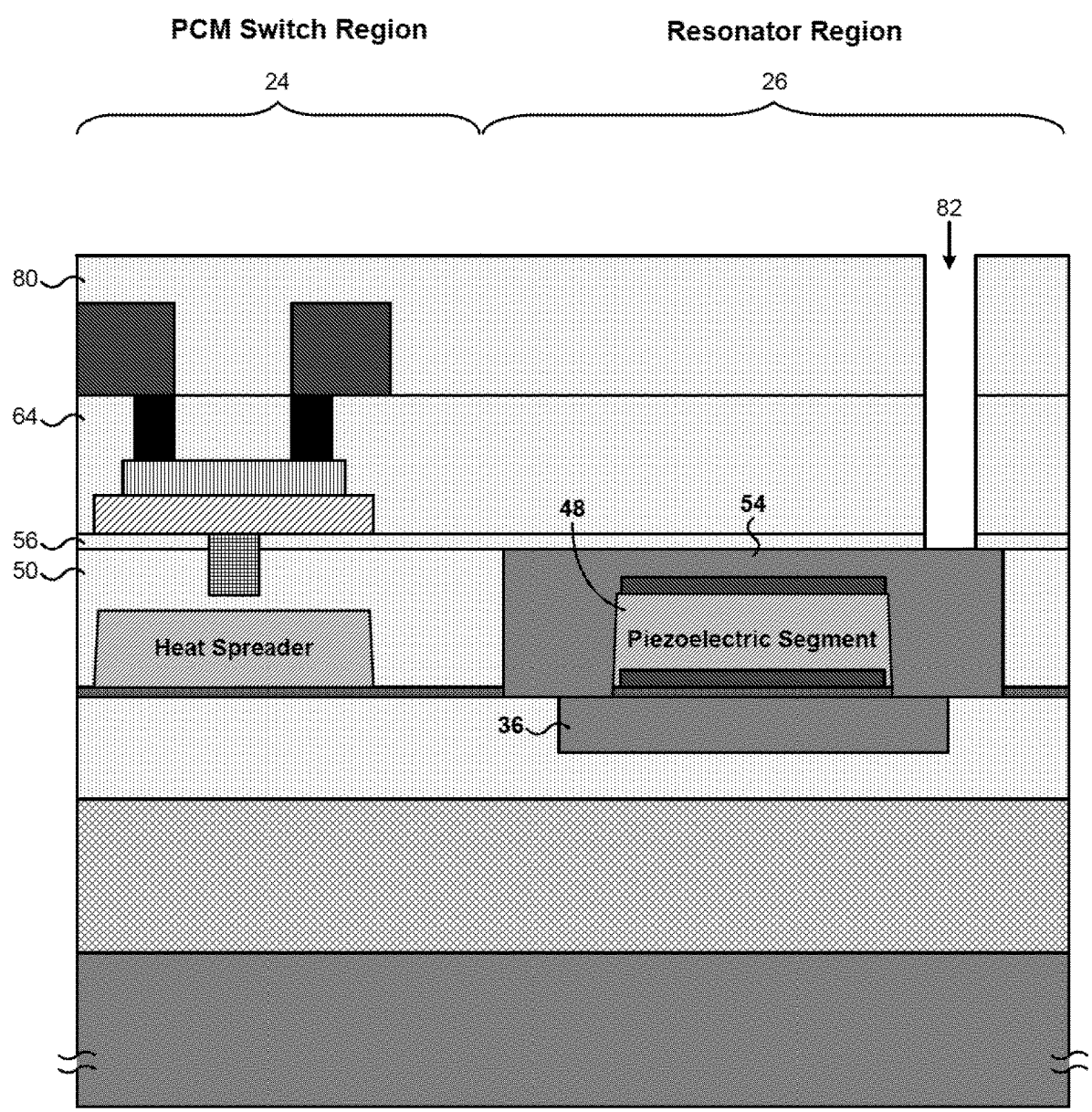
FIG. 20 illustrates a semiconductor structure processed in accordance with action 20 in the flowchart of FIG. 1C according to one implementation of the present application.

FIG. 20 illustrates a semiconductor structure processed in accordance with action 20 in the flowchart of FIG. 1C according to one implementation of the present application. As shown in FIG. 20, the semiconductor structure has PCM switch region 24 and resonator region 26, and release hole 82 is etched in resonator region 26. Release hole 82 extends through fifth dielectric layer 80, fourth dielectric layer 64, and third dielectric layer 56, to second sacrificial material 54 in second dielectric layer 50. Release hole 82 is offset from piezoelectric segment 48 so that a subsequent sealing action does not leave a deposit on piezoelectric segment 48. In one implementation, release hole 82 can extend partially into second sacrificial material 54 in second dielectric layer 50. In one implementation, additional release holes can be formed.

Figure 21A:
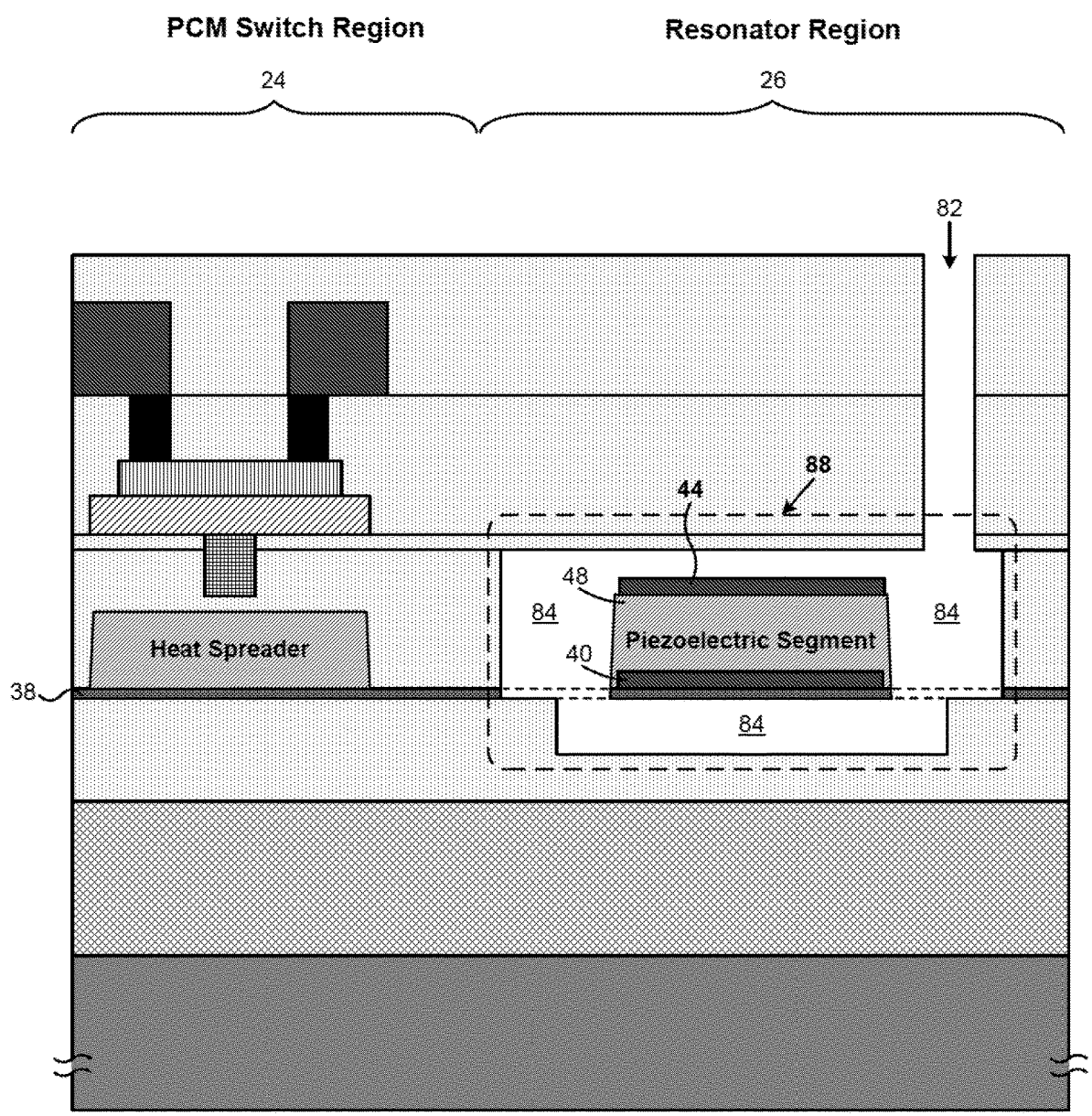
FIG. 21A illustrates a semiconductor structure processed in accordance with action 21 in the flowchart of FIG. 1C according to one implementation of the present application.

FIG. 21A illustrates a semiconductor structure processed in accordance with action 21 in the flowchart of FIG. 1C according to one implementation of the present application. As shown in FIG. 21A, the semiconductor structure has PCM switch region 24 and resonator region 26, and first sacrificial material 36 and second sacrificial material 54 (shown in FIG. 20) are released through release hole 82, thereby forming cavity 84. First sacrificial material 36 and second sacrificial material 54 can be released, for example, using xenon difluoride ($XeF_2$) nitrogen trifluoride ($N_xF_3$), or another release etchant. When the sacrificial material comprises polyamide, oxygen ($O_2$) and/or oxyfluoride (OF) can be used as an etchant. After forming cavity 84, resonator 88 is substantially completed in resonator region 26. Resonator 88 includes membrane layer 38, bottom electrode 40, top electrode 44, piezoelectric segment 48, and cavity 84. It is noted that FIG. 21A illustrates a cross-sectional view of a semiconductor structure. In another plane (not shown in FIG. 21A), membrane layer 38 may still be unetched. Membrane layer 38 is illustrated with dashed lines to indicate portions that do not lie in the cross-sectional plane of FIG. 21A.

Figure 21B:
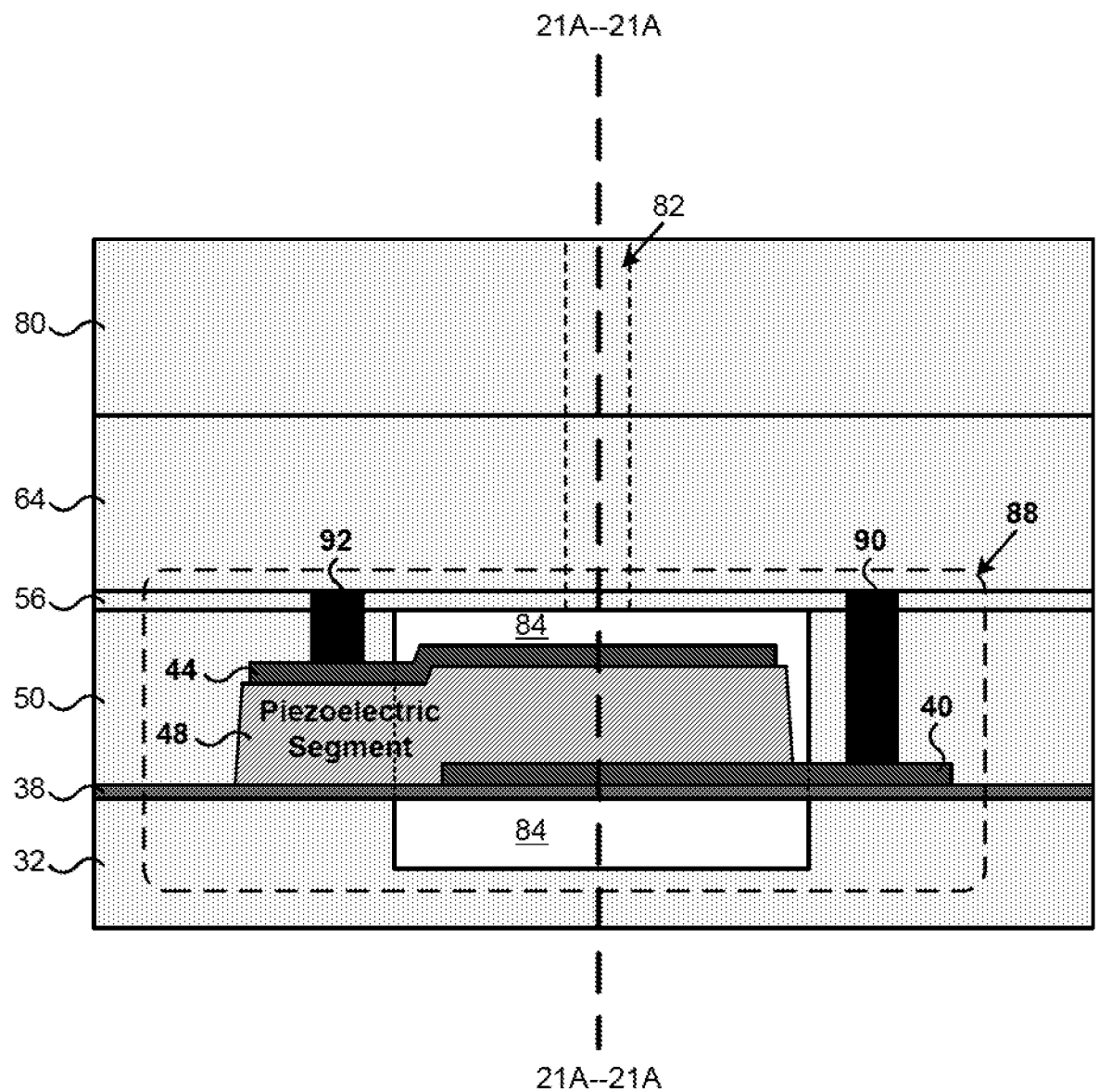
FIG. 21B illustrates a cross-sectional view of a portion of a semiconductor structure including a resonator according to one implementation of the present application.

FIG. 21B illustrates a cross-sectional view of a portion of a semiconductor structure including a resonator according to one implementation of the present application. Resonator 88 in FIG. 21B generally corresponds to resonator 88 in FIG. 21A. FIG. 21A represents a cross-sectional view along line "21A-21A" in FIG. 21B. As shown in FIG. 21B, the semiconductor structure includes first dielectric layer 32, second dielectric layer 50, third dielectric layer 56, fourth dielectric layer 64, fifth dielectric layer 80, resonator 88, and release hole 82. Resonator 88 includes membrane layer 38, bottom electrode 40, top electrode 44, piezoelectric segment 48, cavity 84, first electrode contact 90, and second electrode contact 92.

First electrode contact 90 and second electrode contact 92 provide signals to and from resonator 88. In various implementations, first electrode contact 90 and second electrode contact 92 can comprise tungsten (W), copper (Cu), or aluminum (Al). Although not illustrated in FIG. 21B, in various implementations, the semiconductor structure can have any number of vias and interconnect metals situated above first electrode contact 90 and second electrode contact 92.

Cavity 84 is situated between first dielectric layer 32 and third dielectric layer 56. In another plane (not shown in FIG. 21B), cavity 84 is also situated against sides of (i.e., encircling) membrane layer 38, bottom electrode 40, piezoelectric segment 48, and top electrode 44. Portions of cavity 84 are illustrated with dashed lines to indicate portions that do not lie in the cross-sectional plane of FIG. 21B. Likewise release hole 82 is illustrated with dashed lines to indicate that it does not lie in the cross-sectional plane of FIG. 21B.

With proper resonant characteristics, piezoelectric segment 48 can act as a filter or oscillator resonating at a desired frequency between bottom electrode 40 and top electrode 44 based on an applied electrical signal. In the present implementation, resonator 88 is a film bulk acoustic resonator (FBAR) having cavity 84. In another implementation resonator 88 can be a solidly mounted resonator (SMR) having a Bragg reflector, formed using a method similar to the method shown in the flowcharts of FIGS. 1A, 1B, and 1C, except replacing the formation of the first sacrificial material in action 3 and the membrane layer in action 4 with formation of a Bragg reflector. In yet another implementation, resonator 88 can be a surface acoustic wave (SAW) resonator.

Figure 22:
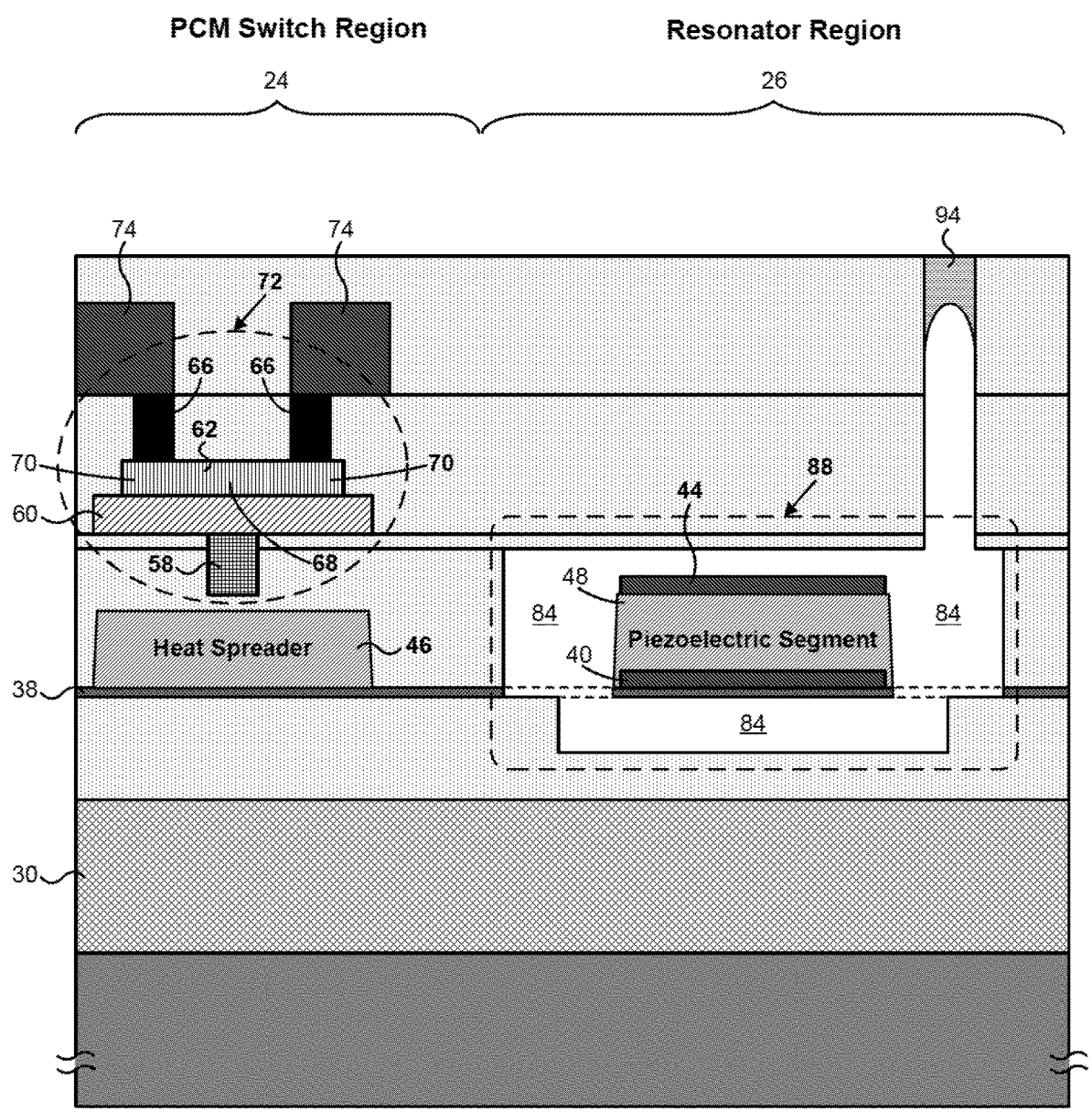
FIG. 22 illustrates a semiconductor structure processed in accordance with action 22 in the flowchart of FIG. 1C according to one implementation of the present application.

FIG. 22 illustrates a semiconductor structure processed in accordance with action 22 in the flowchart of FIG. 1C according to one implementation of the present application. As shown in FIG. 22, the semiconductor structure has PCM switch region 24 and resonator region 26, and release hole 82 (labeled in FIG. 21A) is sealed by sealant 94. Sealant 94 can be, for example, a non-conformal HDP $SiO_2$ deposited until release hole 82 (labeled in FIG. 21A) is pinched off, and then later planarized using CMP. It is noted that planarization is optional and some implementations may not include planarization. Because HDP $SiO_2$ can leave a deposit under release hole 82, release hole 82 is offset from piezoelectric segment 48.

The semiconductor structure of FIG. 22 represents a final semiconductor device according to the method shown in the flowcharts of FIGS. 1A, 1B, and 1C. The semiconductor device of FIG. 22 includes PCM RF switch 72 in PCM switch region 24, and resonator 88 in resonator region 26. PCM RF switch 72 includes heating element 58, thermally conductive and electrically insulating material 60, PCM 62 having active segment 68 and passive segments 70, PCM contacts 66, and interconnect metals 74. Heat spreader 46 is also situated in PCM switch region 24, underlying heating element 58 of PCM RF switch 72. Resonator 88 includes membrane layer 38, bottom electrode 40, top electrode 44, piezoelectric segment 48, and cavity 84.

Active segment 68 of PCM 62 has very low resistivity in a crystalline state, and PCM RF switch 72 has very low ON state resistance ($R_{ON}$). Resonator 88 has very high acoustic energy density. Accordingly, the semiconductor device of FIG. 22 efficiently integrates PCM RF switch 72 and resonator 88 having low losses and high quality factors. Where resonator 88 performs as an RF filter in a circuit comprising PCM RF switch 72, the circuit generally exhibits improved performance as a result of this integration. Moreover, the semiconductor device of FIG. 22 can be implemented with BEOL MLM 30 without significant manufacturing complexity.

Because heat spreader 46 in PCM switch region 24 has high thermal conductivity, it effectively dissipates heat generated by heating element 58 of PCM RF switch 72. Thus, active segment 68 of PCM 62 can rapidly quench and successfully transform phases, and PCM RF switch 72 can switch states with improved reliability. The quicker cooling of PCM RF switch 72 allows PCM 62 to utilize different materials and different dimensions that require faster quench times. The quicker cooling of PCM RF switch 72 also allows more area of PCM 62 to be transformed, creating a wider active segment 68. A wider active segment 68 improves RF performance of PCM RF switch 72 by increasing its breakdown voltage and linearity.

Notably, materials such as $Al_XN_Y$ often exhibit higher variances in material properties amongst different deposits, compared to other semiconductor materials such as Si. Because heat spreader 46 and piezoelectric segment 48 are situated at substantially the same level in the semiconductor device of FIG. 22 and are concurrently formed from shared material 42 (shown in FIG. 7), the semiconductor device of FIG. 22 advantageously reduces processing steps and reduces variances in material properties.

Thus, various implementations of the present application achieve semiconductor devices including a shared material in a PCM switch region and a resonator region, and utilize the inventive PCM RF switch of the present application to overcome the deficiencies in the art and result in effective and practical large scale integration of PCM RF switches with resonators. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor device comprising:
   a phase-change material (PCM) switch region and a resonator region;
   said PCM switch region including a heating element between a heat spreader and a PCM;
   said resonator region including a piezoelectric segment between two electrodes;
   said piezoelectric segment in said resonator region and said heat spreader in said PCM switch region each comprising a shared material.

2. The semiconductor device of claim 1, wherein said heating element is transverse to said PCM and aligned with an active segment of said PCM, and wherein PCM contacts are connected to passive segments of said PCM.

3. The semiconductor device of claim 1, wherein said piezoelectric segment in said resonator region and said heat spreader in said PCM switch region are situated at substantially the same level in said semiconductor device.

4. The semiconductor device of claim 1, wherein said shared material comprises aluminum nitride ($Al_XN_Y$).

5. The semiconductor device of claim 1, wherein said resonator region comprises a film bulk acoustic resonator (FBAR) having a cavity.

6. The semiconductor device of claim 1, wherein said two electrodes comprise a bottom electrode under said piezoelectric segment and a top electrode over said piezoelectric segment.

7. The semiconductor device of claim 1, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

8. The semiconductor device of claim 1, further comprising a thermally conductive and electrically insulating material in said PCM switch region between said heating element and said PCM.

9. The semiconductor device of claim 1, wherein said piezoelectric segment and said heat spreader are situated over a back-end-of-line multi-level metallization (BEOL MLM).

10. The semiconductor device of claim 1, wherein said resonator region comprises a solidly mounted resonator (SMR) having a Bragg reflector.

11. The semiconductor device of claim 1, wherein said resonator region comprises a surface acoustic wave (SAW) resonator.

12. A semiconductor device comprising:
    a phase-change material (PCM) switch region and a resonator region;
    said PCM switch region including a high thermal conductivity material;
    said resonator region including a piezoelectric segment;
    said piezoelectric segment in said resonator region and said high thermal conductivity material in said PCM switch region each comprising a shared material.

13. The semiconductor device of claim 12, wherein said resonator region comprises a resonator within a cavity.

14. The semiconductor device of claim 13, wherein said cavity has a release hole.

15. The semiconductor device of claim 12, wherein said piezoelectric segment in said resonator region and said high thermal conductivity material in said PCM switch region are situated at substantially the same level in said semiconductor device.

16. The semiconductor device of claim 12, wherein said shared material comprises aluminum nitride ($Al_XN_Y$).

17. The semiconductor device of claim 12, wherein said resonator region comprises a film bulk acoustic resonator (FBAR) having a cavity.

18. The semiconductor device of claim 12, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

19. The semiconductor device of claim 12, wherein said piezoelectric segment and said high thermal conductivity material are situated over a back-end-of-line multi-level metallization (BEOL MLM).

20. The semiconductor device of claim 12, wherein said resonator region comprises a solidly mounted resonator (SMR) having a Bragg reflector or a surface acoustic wave (SAW) resonator.

* * * * *